US011520659B2

(12) United States Patent
Meaney et al.

(10) Patent No.: US 11,520,659 B2
(45) Date of Patent: Dec. 6, 2022

(54) REFRESH-HIDING MEMORY SYSTEM STAGGERED REFRESH

(71) Applicant: INTERNATIONAL BUSINESS MACHINES CORPORATION, Armonk, NY (US)

(72) Inventors: Patrick James Meaney, Poughkeepsie, NY (US); Glenn David Gilda, Binghamton, NY (US); David D. Cadigan, Danbury, CT (US); Christian Jacobi, West Park, NY (US); Lawrence Jones, Endwell, NY (US); Stephen J. Powell, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 16/741,017

(22) Filed: Jan. 13, 2020

(65) Prior Publication Data
US 2021/0216401 A1 Jul. 15, 2021

(51) Int. Cl.
| | |
|---|---|
| *G06F 11/10* | (2006.01) |
| *G06F 11/07* | (2006.01) |
| *G11C 29/42* | (2006.01) |
| *G06F 9/30* | (2018.01) |
| *G11C 11/406* | (2006.01) |
| *G06F 11/30* | (2006.01) |

(52) U.S. Cl.
CPC ...... *G06F 11/1076* (2013.01); *G06F 9/30047* (2013.01); *G06F 11/0772* (2013.01); *G06F 11/1044* (2013.01); *G06F 11/3037* (2013.01); *G11C 11/40615* (2013.01); *G11C 29/42* (2013.01)

(58) Field of Classification Search
None
See application file for complete search history.

(56) References Cited

U.S. PATENT DOCUMENTS

| | | | |
|---|---|---|---|
| 7,552,292 B2 | 6/2009 | Hsieh et al. | |
| 7,684,280 B2 | 3/2010 | Jones et al. | |
| 8,181,089 B1 * | 5/2012 | Fernandes | G06F 11/1076 |
| | | | 714/770 |
| 8,200,887 B2 * | 6/2012 | Bennett | G06F 3/064 |
| | | | 711/103 |

(Continued)

OTHER PUBLICATIONS

Nguyen et al., "Nonblocking Memory Refresh", 2018, IEEE (Year: 2018).*

(Continued)

*Primary Examiner* — Cynthia Britt
*Assistant Examiner* — Matthew W Wahlin
(74) *Attorney, Agent, or Firm* — Cantor Colburn LLP; Jeffrey Ingalls

(57) ABSTRACT

A computer-implemented method includes refreshing a set of memory channels in a memory system substantially simultaneously, each memory channel refreshing a rank that is distinct from each of the other ranks being refreshed. Further, the method includes marking a memory channel from the set of memory channels as being unavailable for the rank being refreshed in the memory channel. In one or more examples, the method further includes blocking a fetch command to the memory channel for the rank being refreshed in the memory channel.

20 Claims, 19 Drawing Sheets

FIG. 1

(56) References Cited

U.S. PATENT DOCUMENTS

| | | | |
|---|---|---|---|
| 8,264,903 B1* | 9/2012 | Lee | G11C 11/40611 365/222 |
| 8,599,634 B1 | 12/2013 | Lee | |
| 8,775,858 B2 | 7/2014 | Gower | |
| 9,268,720 B2 | 2/2016 | Wang et al. | |
| 10,176,861 B2* | 1/2019 | Bennett | G11C 5/04 |
| 10,303,545 B1 | 5/2019 | Meaney | |
| 2005/0193166 A1 | 9/2005 | Johnson et al. | |
| 2007/0288690 A1 | 12/2007 | Wang et al. | |
| 2008/0109597 A1 | 5/2008 | Schakel | |
| 2011/0078342 A1 | 3/2011 | Siddabathuni et al. | |
| 2011/0252193 A1 | 10/2011 | Bains | |
| 2012/0254533 A1 | 10/2012 | Jibbe et al. | |
| 2013/0047040 A1* | 2/2013 | Johnson | G06F 11/1044 714/47.2 |
| 2013/0191698 A1* | 7/2013 | Meaney | H03M 13/19 714/758 |
| 2015/0357025 A1 | 12/2015 | Kardach et al. | |
| 2016/0364303 A1* | 12/2016 | Gilda | G06F 1/10 |
| 2018/0096719 A1* | 4/2018 | Tomishima | G11C 5/025 |
| 2018/0203627 A1 | 7/2018 | Gilda | |
| 2019/0065306 A1 | 2/2019 | Margetts | |

OTHER PUBLICATIONS

List of IBM Patents or Patent Applications Treated as Related; Date Filed: Jan. 13, 2020, 2 pages.

Meaney, Patrick J., et al., "IBM zEnterprise redundant array of independent memory subsystem," IBM Journal of Research and Development 56, No. 1.2, Jan./Mar. 2012, 11 pages.

Meaney et al., "Low Latency Availability in Degraded Redundant Array of Independent Memory," U.S. Appl. No. 16/741,008, filed Jan. 13, 2020.

\* cited by examiner

| MARKING STATE | CHIP MARK X | CHIP MARK Y | CHANNEL MARK |
|---|---|---|---|
| A | | | |
| B | ✓ | | |
| C | ✓ | ✓ | |
| D | ✓ | | ✓ |
| E | ✓ | ✓ | ✓ |
| F | ✓ | | ✓ |

FIG. 2

8 Channel RAIM with differential DIMMs

8 Channel RAIM with differential DIMMs

REFRESH-HIDING MEMORY SYSTEM STAGGERED REFRESH

BACKGROUND

The present invention relates generally to computer memory, and more specifically, to staggering refresh of ranks across multiple channels in a multi-channel memory system.

Contemporary main memory systems used in computers are composed of multiple memory devices, which are connected to memory controllers and/or processors via memory interface elements such as buffers, hubs, bus-to-bus converters, etc. The memory devices are located on a memory subsystem such as a memory card or memory module and are often connected via a pluggable interconnection system (e.g., one or more connectors) to a system board (e.g., a motherboard).

Overall computer system performance is affected by each of the key elements of the computer structure, including the performance/structure of the processor(s), any memory cache(s), the input/output (I/O) subsystem(s), the efficiency of the memory control function(s), the performance of the main memory devices(s) and any associated memory interface elements, and the type and structure of the memory interconnect interface(s). For maximizing overall system performance and density, technical solutions are needed that facilitate improving the memory system/subsystem design and/or structure.

SUMMARY

According to one or more embodiments of the present invention, a computer-implemented method includes refreshing a set of memory channels in a memory system substantially simultaneously, each memory channel refreshing a rank that is distinct from each of the other ranks being refreshed. Further, the method includes marking a memory channel from the set of memory channels as being unavailable for the rank being refreshed in the memory channel. In one or more examples, the method further includes blocking a fetch command to the memory channel for the rank being refreshed in the memory channel.

The above-described features can also be provided at least by a system, a computer program product, and a machine, among other types of implementations.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2 depicts a table that defines the marking states for a RAIM code according to the value of the chip marks (x and y) as well as the channel mark in accordance with an embodiment;

Figure 1A:
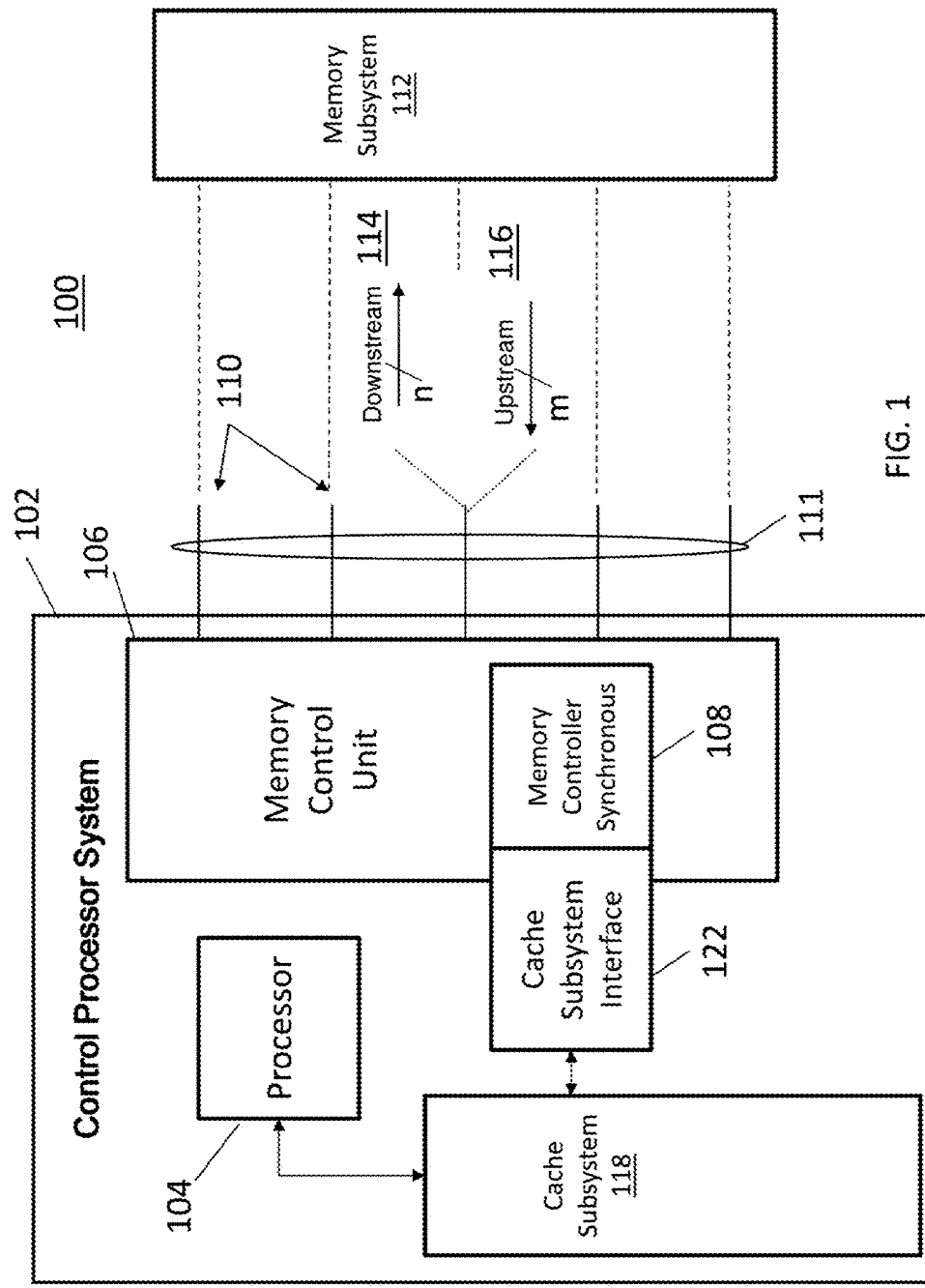
FIG. 1A is a block diagram of a memory system according to one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

In the accompanying figures and following detailed description of the disclosed embodiments, the various elements illustrated in the figures are provided with two or three-digit reference numbers. With minor exceptions, the leftmost digit(s) of each reference number corresponds to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In a memory subsystem, a memory controller typically controls multiple memory channels, where each memory channel has one or more dual in-line memory modules (DIMMs) that include dynamic random access memory (DRAM) devices and in some instances a memory buffer chip. The memory buffer chip typically acts as a slave device to the memory controller, reacting to commands provided by the memory controller. The memory subsystem can be configured as a redundant array of independent memory (RAIM) system to support recovery from failures of either DRAM devices or an entire channel. In RAIM, data blocks are striped across the channels along with check bit symbols and redundancy information.

RAIM systems have been developed to improve performance and/or to increase the availability of storage systems. RAIM distributes data across several independent memory modules (each memory module contains one or more memory devices). There are many different RAIM schemes that have been developed each having different characteristics and different pros and cons associated with them. Performance, availability, and utilization/efficiency (the percentage of the DIMMs that actually hold customer data) are just some of the characteristics. The tradeoffs associated with various schemes have to be carefully considered because improvements in one characteristic can often result in reductions in another.

As used herein, the term "memory channel" refers to a logical entity that is attached to a memory controller and which connects and communicates to registers, memory buffers, and memory devices. Thus, for example, in a cascaded memory module configuration a memory channel would comprise the connection means from a memory controller to a first memory module, the connection means from the first memory module to a second memory module, and all intermediate memory buffers, etc.

Memory "refreshes" are the mechanism by which data stored in a DRAM is kept alive so that the data stored in the memory does not either degrade or become completely lost. For example, when a conventional computer system is completely shut down and all power is removed, all the data stored in a DRAM device for the computer becomes irrecoverable. Memory refreshes are commonly initiated by a "memory controller" interacting with the memory, in which the memory controller refreshes a portion of the memory module as part of, or prior to conducting an operation on the memory module, such as a read or write operation. While in active use, a memory controller will also persist with memory "refreshes" as appropriate, so that data stored in the memory does not degrade. When the memory's refreshes are under the control of an external device, such as a memory controller, the memory device simply responds accordingly to directives received from the external device/external memory controller (e.g., the memory will refresh an appropriate portion when directed externally).

In other examples, a memory refresh occurs as a "self-refresh" mechanism, in which the refreshes are not initiated by an external device, such as the above memory controller, but rather, such memory refreshes are triggered internally by the memory module itself, causing a refresh operation, for example, on each row or rank of the memory in an iterative fashion, over all the rows or ranks within the memory. Memory "self-refreshes" are used, for example, when a memory module is placed into a low power mode, such as when the memory is not actively being utilized, but the contents of the memory are to be maintained in an accurate state.

Because of large refresh times (over 5× the base fetch time for a rank), a fetch to a rank being refreshed incurs a large delay penalty. In RAIM systems all the refreshes for a given rank are aligned so that the penalties for different channels are limited to as small a window as possible.

As DRAM chips have improved in capacity and performance, the refresh time (time needed to keep the DRAM cells to maintain their charge) has also increased. For instance, for a 4 Gb, DDR3 DRAM, the refresh rate was tRFC=260 ns every tRFI=7.0 us=3.7% of the time. For a 16 Gb, DDR4 DRAM, the refresh rate is expected to be tRFC=350-550 ns every tRFI=7.0 us=5-8% of the time. In addition, as memory systems add more memory, there are more ranks that need to be refreshed in parallel, leading to multiple ranks needing to be refreshed at the same time.

Such technical challenges with DRAM chips and memory systems, in general, are addressed by one or more embodiments of the present invention. It should be noted that other solutions to solve such technical challenges of increasing refresh times include using a fine granular refresh, such as with DDR4 memory modules. In other solutions, one channel is taken 'offline' to burst refreshes, and then, another channel is switched to for refresh until all channels covered.

Embodiments of the present invention provide improved solutions to the technical challenges by using a "staggered refresh", which is a memory refresh such that the same rank is not refreshed at the same time across the multiple channels. Further, embodiments of the present invention also use a rank refresh channel mark to ignore the contents of a channel during a time that channel is refreshing a rank. Furthermore, embodiments of the present invention release the data to the memory controller using the channel mark in order to save latency associated with a refresh penalty that is incurred on a fetch to a rank that has a refresh pending.

FIG. 1A depicts an example memory system 100 which may be part of a larger computer system structure. A control processor (CP) system 102 is a processing subsystem that includes at least one processor 104 configured to interface with a memory control unit (MCU) 106. The processor 104 can be a multi-core processor or module that processes read, write, and configuration requests from a system controller (not depicted). The MCU 106 includes a memory controller synchronous (MCS) 108, also referred to as a memory controller, that controls communication with a number of channels 110 for accessing a plurality of memory devices in a memory subsystem 112. The MCU 106 and the MCS 108 may include one or more processing circuits, or processing may be performed by or in conjunction with the processor 104. In the example of FIG. 1A, there are eight channels 110 that can support parallel memory accesses as a virtual channel 111. In an embodiment of the present invention, the memory system 100 is an eight-channel redundant array of independent memory (RAIM) system, where seven of the channels 110 provide access to columns of data and checkbit memory, and an eighth channel provides access to RAIM parity bits in the memory subsystem 112. It should be noted that in other embodiments of the present invention the number of channels can be different than the eight in the present example. It should also be noted that in other embodiments the data and RAIM parity bits can be distributed across the channels using a different scheme.

Each of the channels 110 is a synchronous channel which includes a downstream bus 114 and an upstream bus 116. Each downstream bus 114 of a given channel 110 may include a different number of lanes or links than a corresponding upstream bus 116. In the example of FIG. 1A, each downstream bus 114 includes n-unidirectional high-speed serial lanes and each upstream bus 116 includes m-unidirectional high-speed serial lanes. Commands and/or data can be transmitted and received on each of the channels 110. The transmitted command/data are decomposed into individual lanes for serial communication. In an embodiment, data is transmitted at about 25.6 gigabits per second (Gbps), and each transmitting bus transmits four-bit (or four-lane) groups serially per channel 110. The memory subsystem 112 receives, de-skews, and de-serializes each four-bit group on the downstream bus 114 to reconstruct the data per channel 110 from the MCU 106. Likewise, the memory subsystem 112 can transmit to the MCU 106 a response/data as four-bit groups on the upstream bus 116 per channel 110. It should be noted that the data transmission rate, number of channels, number of lanes described in the scenario above can be different values in other embodiments of the present invention.

The CP system 102 may also include a cache subsystem 118 that interfaces with the processor 104. A cache subsystem interface 122 of the CP system 102 provides a communication interface to the cache subsystem 118. The cache subsystem interface 122 may receive data from the memory subsystem 112 via the MCU 106 to store in the cache subsystem 118.

Figure 1B:
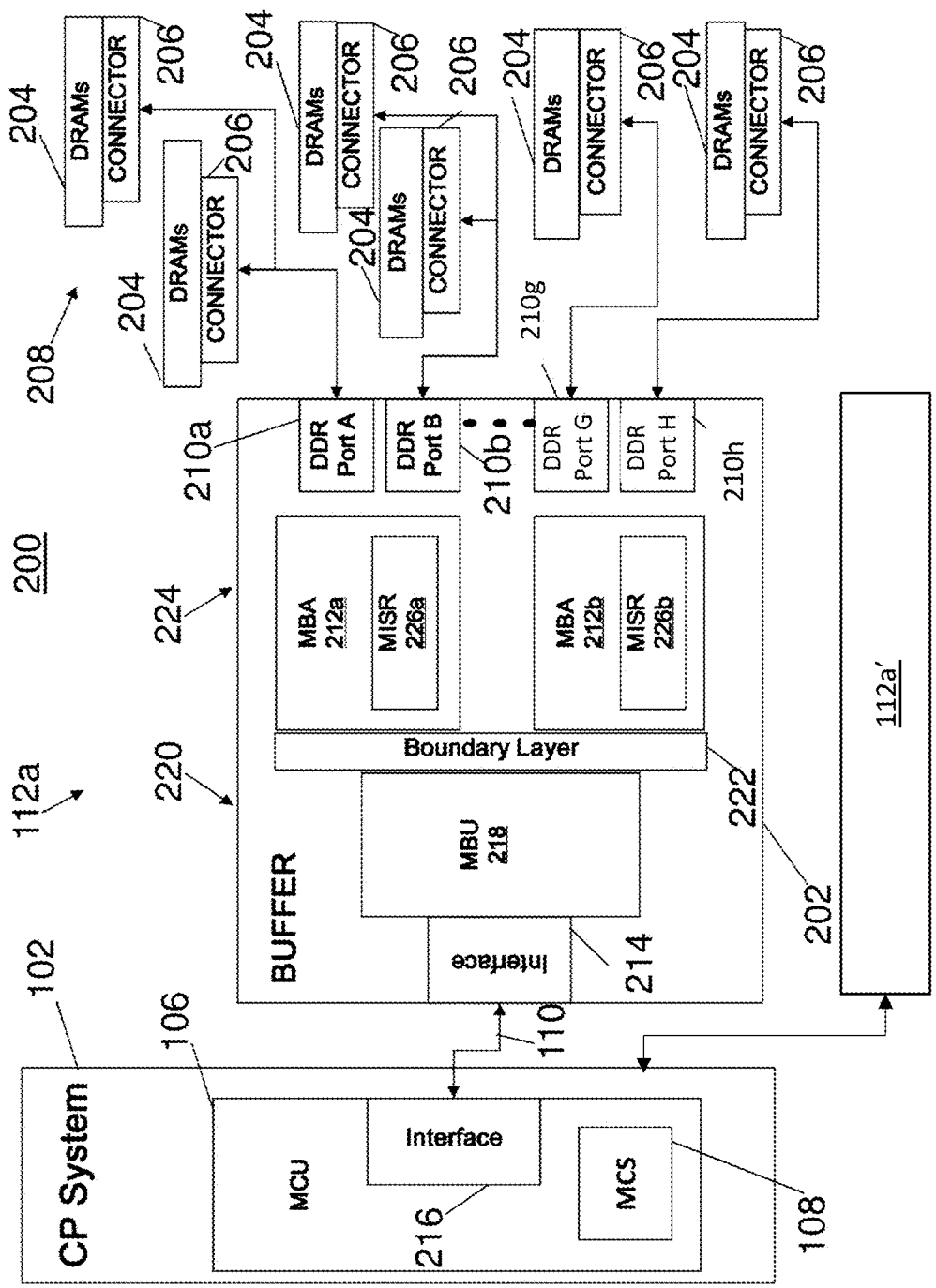
FIG. 1B is a block diagram of a memory subsystem in a planar configuration according to one or more embodiments of the present invention.

FIG. 1B depicts an example of a memory subsystem 112a as an instance of the memory subsystem 112 of FIG. 1A in a planar configuration 200 in accordance with an embodiment. The example of FIG. 1B only depicts one channel 110 of the memory subsystem 112a; however, it will be understood that the planar configuration 200 can include multiple instances of the memory subsystem 112a, 112a', etc. as depicted in FIG. 1B, e.g., eight instances. As illustrated in FIG. 1B, the planar configuration 200 includes a memory buffer chip 202 connected to a plurality of dynamic random access memory (DRAM) devices 204. The buffer chip 202 can be connected to the DRAM devices 204 via connectors 206. The DRAM devices 204 may be organized as ranks of one or more dual in-line memory modules (DIMMs) 208. Each of the connectors 206 is coupled to a double data rate (DDR) port 210, also referred to as a memory interface port 210 of the memory buffer chip 202, where each DDR port 210 can be coupled to more than one connector 206. In the example of FIG. 1B, the memory buffer chip 202 includes DDR ports 210a-210h. The DDR ports 210a-h are each coupled to the connectors 206 and a set of shared memory buffer adaptors (MBA) 212a-212b. In one or more embodiments of the present invention, there can be a different number of MBAs than those depicted herein. The DDR ports 210a-210h are JEDEC-compliant memory interfaces for issuing memory commands and reading and writing memory data to the DRAM devices 204.

The MBAs 212a and 212b include memory control logic for managing accesses to the DRAM devices 204, as well as controlling timing, refresh, calibration, and the like. The MBAs 212a and 212b can be operated in parallel, such that an operation on DDR ports 210a or 210g can be performed in parallel. In an embodiment of the present invention, a plurality of MBAs 212 may be operated independently.

The memory buffer chip 202 also includes an interface 214 to communicate with a corresponding interface 216 of the MCU 106 via the channel 110. Synchronous communication is established between the interfaces 214 and 216. As such, a portion of the memory buffer chip 202 including a memory buffer unit (MBU) 218 operates in a nest domain 220 which is synchronous with the MCS 108 of the CP system 102. A boundary layer 222 divides the nest domain 220 from a memory domain 224. The MBAs 212a and 212b and the DDR ports 210a-210h, as well as the DRAM devices 204, are in the memory domain 224. A timing relationship between the nest domain 220 and the memory domain 224 is configurable, such that the memory domain 224 can operate asynchronously relative to the nest domain 220, or the memory domain 224 can operate synchronously relative to the nest domain 220. The boundary layer 222 is configurable to operate in a synchronous transfer mode and an asynchronous transfer mode between the nest and memory domains 220, 224. The memory buffer chip 202 may also include one or more multiple-input shift-registers (MISRs) 226, as further described herein. For example, the MBA 212a can include one or more MISR 226a, and the MBA 212b can include one or more MISR 226b. Other instances of MISRs 226 can be included elsewhere within the memory system 100. As a further example, one or more MISRs 226 can be positioned individually or in a hierarchy that spans the MBU 218 and MBAs 212a and 212b and/or in the MCU 106.

The boundary layer 222 is an asynchronous interface that permits different DIMMs 208 or DRAM devices 204 of varying frequencies to be installed into the memory domain 224 without the need to alter the frequency of the nest domain 220. This allows the CP system 102 to remain intact during memory installs or upgrades, thereby permitting greater flexibility in custom configurations. In the asynchronous transfer mode, a handshake protocol can be used to pass commands and data across the boundary layer 222 between the nest and memory domains 220, 224. In the synchronous transfer mode, timing of the memory domain 224 is phase adjusted to align with the nest domain 220 such that a periodic alignment of the nest and memory domains 220, 224 occurs at an alignment cycle in which commands and data can cross the boundary layer 222.

The nest domain 220 is mainly responsible for reconstructing and decoding the source synchronous channel data, applying any necessary addressing translations, performing coherency actions, such as directory look-ups and cache accesses, and dispatching memory operations to the memory domain 224. The memory domain 224 may include queues, a scheduler, dynamic power management controls, hardware engines for calibrating the DDR ports 210a-210h, and maintenance, diagnostic, and test engines for discovery and management of correctable and uncorrectable errors. There may be other functions in the nest or memory domain. For instance, there may be a cache of embedded DRAM (eDRAM) memory with a corresponding directory. If the cache is created for some applications and other instances do not use it, there may be power savings by connecting a special array voltage (e.g., VCS) to ground. These functions may be incorporated within the MBU 218 or located elsewhere within the nest domain 220. The MBAs 212a and 212b within the memory domain 224 may also include logic to initiate autonomic memory operations for the DRAM devices 204, such as refresh and periodic calibration sequences in order to maintain proper data and signal integrity. In some embodiments of the present invention, refresh can be handled as self-timed refresh, within the DRAM chips 204. In some embodiments of the present invention, refresh is handled from the MCU 106, MCS 108, processor 104, or from elsewhere in the system, including using code. In an embodiment, correctable and uncorrectable errors are applied to internal memory devices only. In an embodiment, system memory data, meta, and ECC are all treated as pass-thru data within the nest domain 220 and memory domain 224.

Figure 1C:
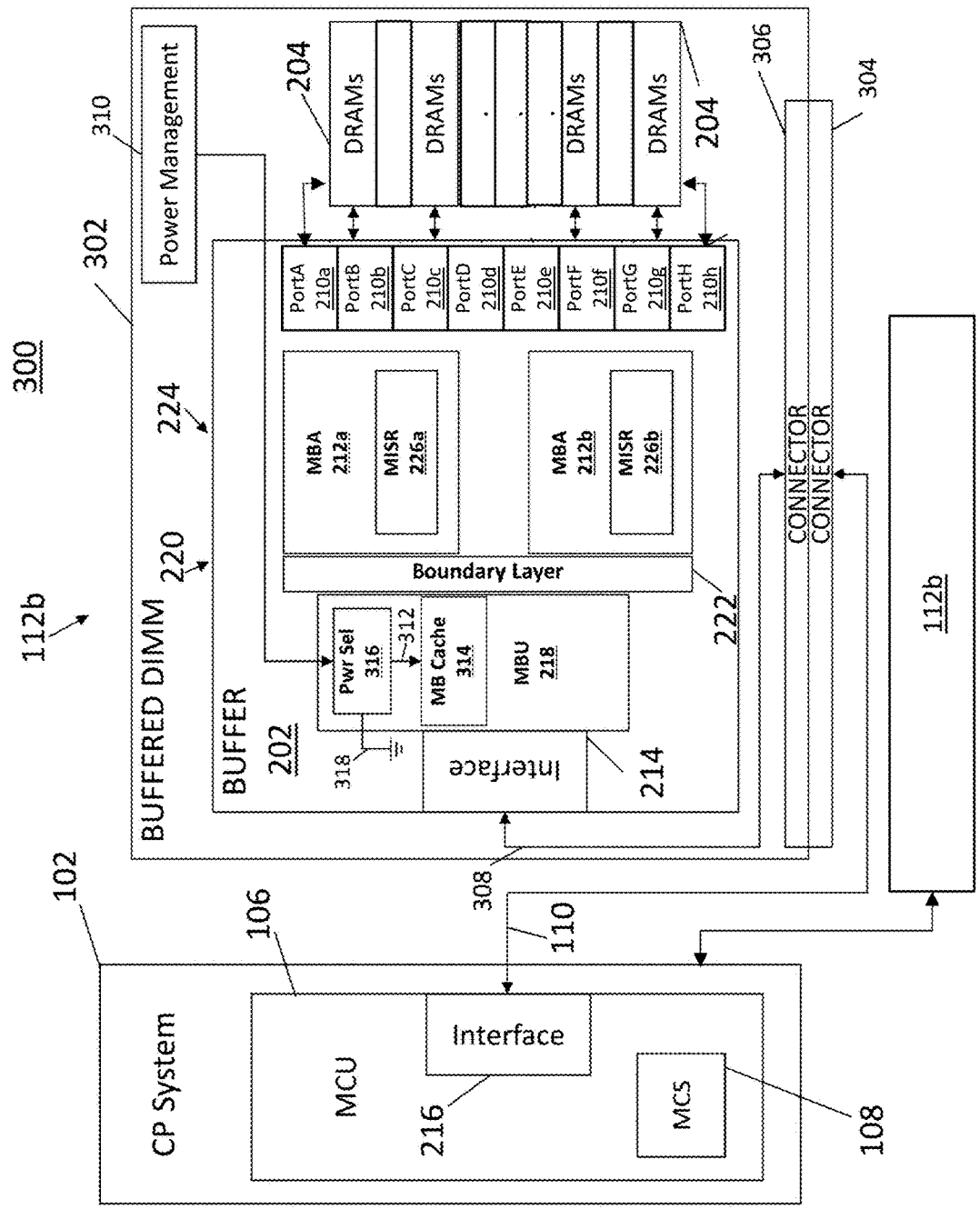
FIG. 1C is a block diagram of a memory subsystem in a buffered DIMM configuration in accordance with an embodiment.

FIG. 1C depicts a memory subsystem 112b as an instance of the memory subsystem 112 of FIG. 1A is a buffered DIMM configuration 300 in accordance with an embodiment. The buffered DIMM configuration 300 can include multiple buffered DIMMs 302 within the memory subsystem 112b, e.g., eight or more instances of the buffered DIMM 302, where a single buffered DIMM 302 is depicted in FIG. 1C for purposes of explanation. The buffered DIMM 302 includes the memory buffer chip 202 of FIG. 1B. As in the example of FIG. 1B, the MCS 108 of the MCU 106 in the CP system 102 communicates synchronously on channel 110 via the interface 216. In the example of FIG. 1C, the channel 110 interfaces to a connector 304, e.g., a socket, that is coupled to a connector 306 of the buffered DIMM 302. A signal path 308 between the connector 306 and interface 214 of the memory buffer chip 202 enables synchronous communication between the interfaces 214 and 216.

As in the example of FIG. 1B, the memory buffer chip 202 as depicted in FIG. 1C includes the nest domain 220 and the memory domain 224. Similar to FIG. 1B, the memory buffer chip 202 may include one or more MISRs 226, such as one or more MISR 226a in MBA 212a and one or more MISR 226b in MBA 212b. In the example of FIG. 1C, the MBU 218 passes commands across the boundary layer 222 from the nest domain 220 to the MBA 212a and/or to the MBA 212b in the memory domain 224. The MBA 212a interfaces with a subset of DDR ports, for example, 210a-210d, and the MBA 212b interfaces with the remaining DDR ports 210e-210h. Rather than interfacing with DRAM devices 204 on one or more DIMMs 208 as in the planar configuration 200 of FIG. 1B, the DDR ports 210a-210h can interface directly with the DRAM devices 204 on the buffered DIMM 302. It is understood that the configuration and communication between the one or more components can be different in one or more embodiments of the present invention than what is described herein.

The memory subsystem 112b may also include power management logic 310 that provides a voltage source for a voltage rail 312. The voltage rail 312 is a local cache voltage rail to power a memory buffer cache 314. The memory buffer cache 314 may be part of the MBU 218. A power selector 316 can be used to determine whether the voltage rail 312 is sourced by the power management logic 310 or tied to ground 318. The voltage rail 312 may be tied to ground 318 when the memory buffer cache 314 is not used, thereby reducing power consumption. When the memory buffer cache 314 is used, the power selector 316 ties the voltage rail 312 to a voltage supply of the power management logic 310. Fencing and clock gating can also be used to better isolate voltage and clock domains. In an embodiment, the memory buffer chip 202 does not implement a memory buffer cache 314.

As can be seen in reference to FIGS. 1B and 1C, a number of memory subsystem configurations can be supported in embodiments. Varying sizes and configurations of the DRAM devices 204 can have different address format requirements, as the number of ranks and the overall details of slots, rows, columns, banks, bank groups, and/or ports may vary across different DRAM devices 204 in embodiments. Various stacking architectures (for example, 3-dimensional die stacking, or 3DS) may also be implemented, which may include master ranks and slave ranks in the packaging architecture. Each of these different configurations of DRAM devices 204 may require a unique address mapping table. Therefore, generic bits may be used by the MCU 106 to reference particular bits in a DRAM device 204 without having full knowledge of the actual DRAM topology, thereby separating the physical implementation of the DRAM devices 204 from the MCU 106. The memory buffer chip 202 may map the generic bits to actual locations in the particular type(s) of DRAM that is attached to the memory buffer chip 202. The generic bits may be programmed to hold any appropriate address field, including but not limited to memory base address, rank (including master or slave), row, column, bank, bank group, and/or port, depending on the particular computer system.

As noted herein, in a RAIM system, if one of the memory channels fails (e.g., a memory module in the channel), the redundancy allows the memory system to use data from one or more of the other memory channels to reconstruct the data stored on the memory module(s) in the failing channel. The reconstruction is also referred to as error correction. For example, in an N-channel RAIM, if there are no errors, N−1 channels are sufficient to fetch all the data that is needed. That is, in an 8-channel RAIM, if data from 7 of 8 channels has arrived at the memory controller 106, with the right controls, the memory controller can reconstruct the necessary data.

In one or more embodiments of the present invention, the memory system depicted in FIG. 1 is a RAIM memory system and the eight channels are lockstep channels (i.e., the eight memory interface busses 110 are accessed in unison with each other). In one or more embodiments of the present invention, the memory interface busses 110 are accessed at different times, but the data is synchronized within the MCU 106, MCS 108, Interface 216, or elsewhere, where the RAIM error correction takes place.

The RAIM system depicted in FIG. 1 can be implemented using the RAIM ECC code described herein which has the property that one of the channel's data is a bitwise Boolean operation of the other seven channel's data with additional check bits included in order to correct for additional errors. Other schemes can be used to implement the RAIM ECC code in one or more embodiments of the present invention. In the embodiment depicted in FIG. 1, the decoder 112 is located in the memory controller 106. In embodiments of the present invention, the decoder 112 is located in the processor 104, the cache subsystem 118, the memory controller 106, and/or on other hardware/software locations in the memory system 110. Embodiments of the RAIM system depicted in FIGS. 1A-1C can be implemented using RAIM ECC code that has data and ECC bits distributed across the channels (e.g. 32 bytes of data plus one or two bytes of ECC within in each channel).

As used herein, the term "mark" refers to is an indication given to an ECC that a particular symbol or set of symbols of a read word are suspected to be faulty or need reconstruction. The ECC can then use this information to enhance its error correction properties. As used herein, the term "correctable error" or "CE" refers to an error that can be corrected while the system is operational, and thus a CE does not cause a system outage. As used herein, the term "uncorrectable error" or "UE" refers to an error that cannot be corrected while the memory system is operational, and thus correction of a UE causes the memory system to be off-line for some period of time while the cause of the UE is being corrected (e.g., by replacing a memory device, by replacing a memory module, recalibrating and interface, through software or hardware recovery, etc.). In one or more embodiments, a UE does not cause a system outage.

The ECC code described herein supports incorporating a special uncorrectable error (SPUE) signature into an encoded data symbol so that in the absence of new errors, and irrespective of the chip and channel marking state and the errors in the marked chips/channel, the SPUE is still detectable as an SPUE. Even if there are a large number of errors on top of the codeword, the data will still be flagged as a UE. This is necessary to protect against UE data that must be stored to memory to keep soft errors from having that data appear good (i.e. Clean or CE).

FIG. 2 depicts a table that defines the marking states for a RAIM code according to the value of the chip marks (x and y) as well as the channel mark in accordance with an embodiment. A checkmark indicates that the associated mark has a non-default valid value (i.e., the mark is pointing to a chip/channel). The absence of a checkmark indicates that the corresponding mark is pointing to its default value. It should be noted that other types of marks can be used in other embodiments of the present invention. If a channel has a mark associated with it, for example in rows D-F, the channel can have a CE or a UE associated with it. Embodiments include various numbers of chip marks, channel marks, as well as temporary recovery marks, power marks, refresh rank marks, and other temporary or permanent marks.

Figure 3:
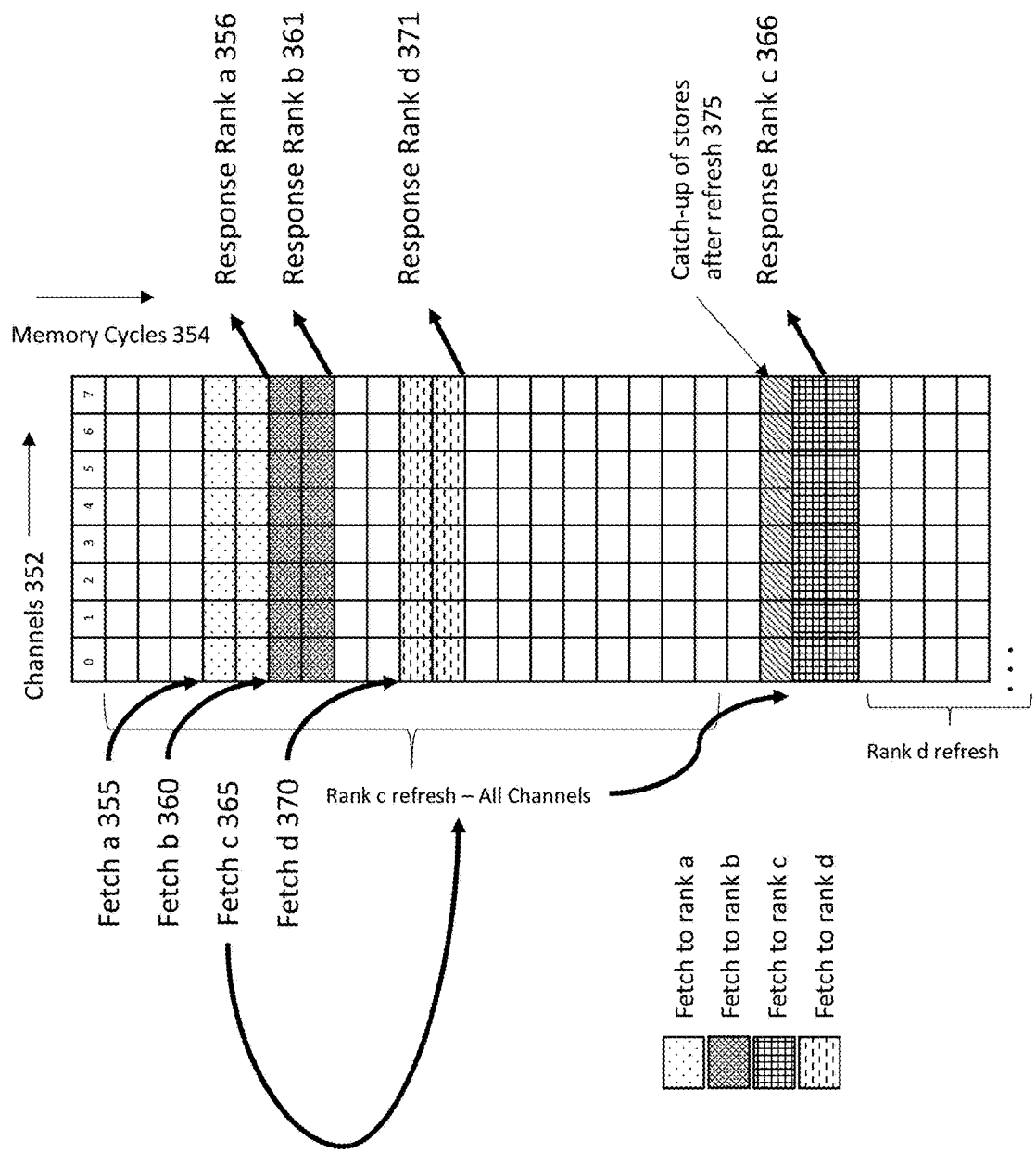
FIG. 3 depicts a performance degrade because of a refresh in a memory sub system.

FIG. 3 depicts a performance degrade because of a refresh in a memory subsystem. Here, a visualization of memory cycles 354 across channels 352 are depicted during fetch operation being performed. Here, the number of channels 352 depicted is eight (0-7), however, other embodiments can have a different number of channels. The fetch operation includes fetching data from all of the ranks—a, b, c, and d. Here, four ranks are used, however, other embodiments can have a different number of ranks. It should also be noted that the memory cycles are shown to depict chronological operation, however, the visualization is not to scale. The memory cycles 354 are depicted as one box or two boxes per cycle, for the purposes of demonstration of relative time. Therefore, the actual correspondence of memory cycles vs. number of tabular boxes in any of the figures (e.g. FIG. 3, FIG. 5, FIG. 6, FIG. 8, FIG. 10, FIG. 11, FIG. 14, or FIG. 15) is not assumed to be binding or limiting.

In the case depicted in FIG. 3, consider that the rank c is being refreshed across all the channels (0-7) 352 during the depicted memory cycles (0-18) of the fetch operation. The fetch operations on ranks a, b, and d, complete relatively quicker than the fetch operation for rank c. Accordingly, fetch a 355, fetch b 360, fetch d 370, are shown to complete substantially in about two memory cycles with respective responses, response a 356, response b 361, and response d 371 being provided to the memory controller 102.

The fetch c 365 operation for the rank c must wait until the rank c refresh completes. Upon completion of the rank c refresh, response c 366 is provided to the memory controller 102. In one or more examples, a catch up of stores 375 can consume one or more memory cycles after the refresh completes and prior to when the response rank c initiates. At some time later, rank d (or any other rank) is refreshed, causing a similar conflict and delay situation for that refreshing rank, as depicted as starting in memory cycle 23 if FIG. 3. Accordingly, when a fetch hits the refreshing rank, the data is delayed until the refresh is complete. Note that all references to memory cycle(s) are relative times and should not be assumed to be absolute DDR memory cycles. Also, the actual fetch responses for rank a 356, rank b 361, and rank d 371 do not necessarily have to be in order. These timings and cycle relationships are for illustrative purposes and should not be construed as limitations to embodiments of the invention.

Figure 4:
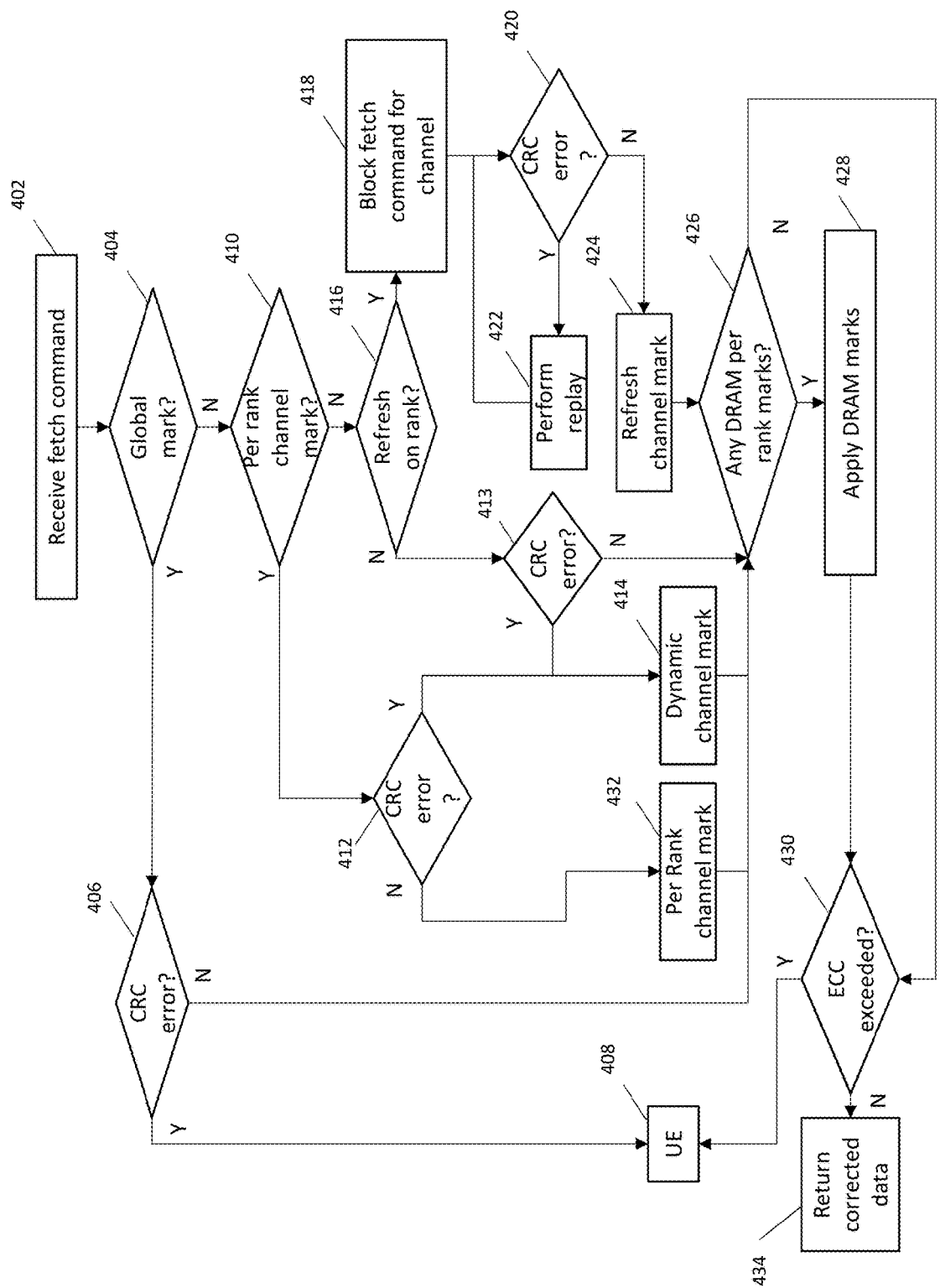
FIG. 4 depicts a flowchart of a method for performing a staggered rank refresh according to one or more embodiments of the present invention.
Figure 5:
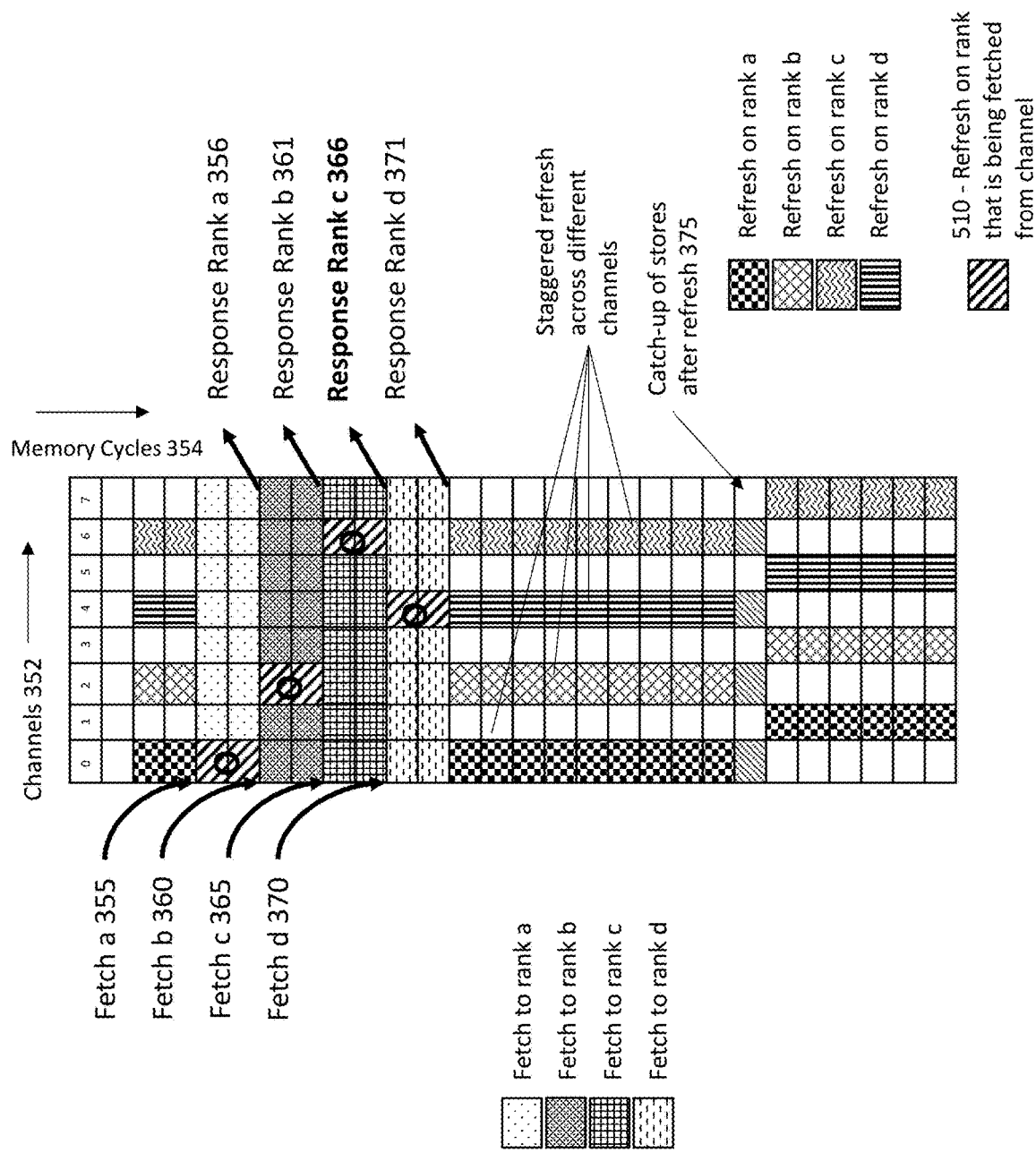
FIG. 5 depicts the performance of a fetch operation while the staggered rank refresh is being performed according to one or more embodiments of the present invention.

FIG. 4 depicts a flowchart of a method for performing a staggered rank refresh according to one or more embodiments of the present invention. FIG. 5 depicts the performance of a fetch operation while the staggered rank refresh is being performed according to one or more embodiments of the present invention.

The memory controller is continuously performing "staggered refresh," in which each of the channels (0-7) 352 is refreshing a different rank simultaneously (in parallel) as depicted in FIG. 5. For example, at a given time point in FIG. 5, channel 0 is refreshing rank a, channel 2 is refreshing rank b, channel 4 is refreshing rank d, and channel 6 is refreshing rank c. The fetches are only performed on the channels 352 that are not refreshing the rank that is to be fetched as described further.

The method includes receiving a command for a fetch command, at block 402. The method includes determining if a global mark has been generated, at block 404. The global mark is generated when one or more of the channels has a mark associated with it. If there is a global mark in one channel 404 and there is also a CRC error mark in another channel 406, an uncorrectable error (UE) is deemed to have occurred 408. In such a case, the fetch operation is abandoned as the memory system 100 is in UE and the data is deemed to be corrupted/invalid. In an embodiment of the invention, the CRC error invokes a replay or retry in an attempt to correct the data and to recover. If there is no CRC error in any of the channels that do not have global marks 406, the method of performing a staggered refresh can proceed to checking for DRAM rank marks, at block 426.

If a global mark does not exist 404, it is determined whether a per rank channel mark is required, at block 410. A per rank channel mark is a mark that is applied to a specific channel only for a certain rank. This is used to increase the efficiency and effectiveness of the ECC code to cover multiple DRAM marks within a given rank, without exhausting the DRAM marks (described later). A per rank channel mark is also used to provide a finer granularity (i.e. per rank) on a channel mark rather than exhausting a global channel mark (which applies to all ranks in a channel). If the per rank channel mark is required for a channel 410, it is determined if a CRC error exists in an unmarked channel, at block 412. A dynamic channel mark is generated for the channel if a CRC error exists, at block 414. In this case, the per rank channel mark is NOT applied, because only one channel can be marked at a time. This dynamic channel mark is only used to correct the data associated with the CRC. Future fetches do not use that dynamic mark unless they also get CRC errors. The method of performing a staggered refresh can proceed to checking for DRAM rank marks, at block 426.

In some embodiments of the present invention, instead of creating the dynamic channel mark (at block 414) the method includes performing a recovery or a replay of the fetch command for the channel that had a CRC error. In that case, dynamic channel mark is not required and the per rank channel mark can be applied later, when the data comes back.

If a CRC error is not detected at block 412, a per rank channel mark is applied to the channel requiring a per rank channel mark 432. The method of performing a staggered refresh can proceed to checking for DRAM rank marks, at block 426.

If the per rank channel mark is not needed, at block 410, it is checked whether a refresh is being performed on the rank that is to be fetched from the channel, at block 416. If a refresh is not being performed, the data is fetched and checked if a CRC error exists, at block 413. A dynamic channel mark 414 is applied to the channel that detected a CRC error, in case a CRC error is detected, at block 413. If a CRC error is not detected at block 413, the method of performing a staggered refresh can proceed to checking for DRAM rank marks, at block 426.

If a refresh is being performed in the specific channel (at block 416) for the particular rank that is to be fetched, the fetch command is blocked for that channel, at block 418. In some embodiments, the fetch command is sent to all the channels, including the channel that is refreshing the rank being fetched, and any blocking may occur on the data after the fetch is returned to the MCU 106. This may be advantageous if the MCU 106 does not have precise knowledge of when refreshes are being scheduled in buffer 220. Also, it may be advantageous for certain memory fetch commands where data for all 8 memory channels is used when available, such as a memory scrub.

A CRC error check is performed on the fetched data, at block 420. If a CRC error exists, the memory controller 102 can perform an automatic replay, which resends the buffered data, at block 422. In an embodiment, an automatic replay is performed only in the one or more channels that had CRC errors. In the case of a replay, the fetch data is checked again for CRC errors 420, after the replay. In an embodiment, replays can be performed indefinitely or a finite amount of times up to a time limit or loop limit or some other limit.

Figure 6:
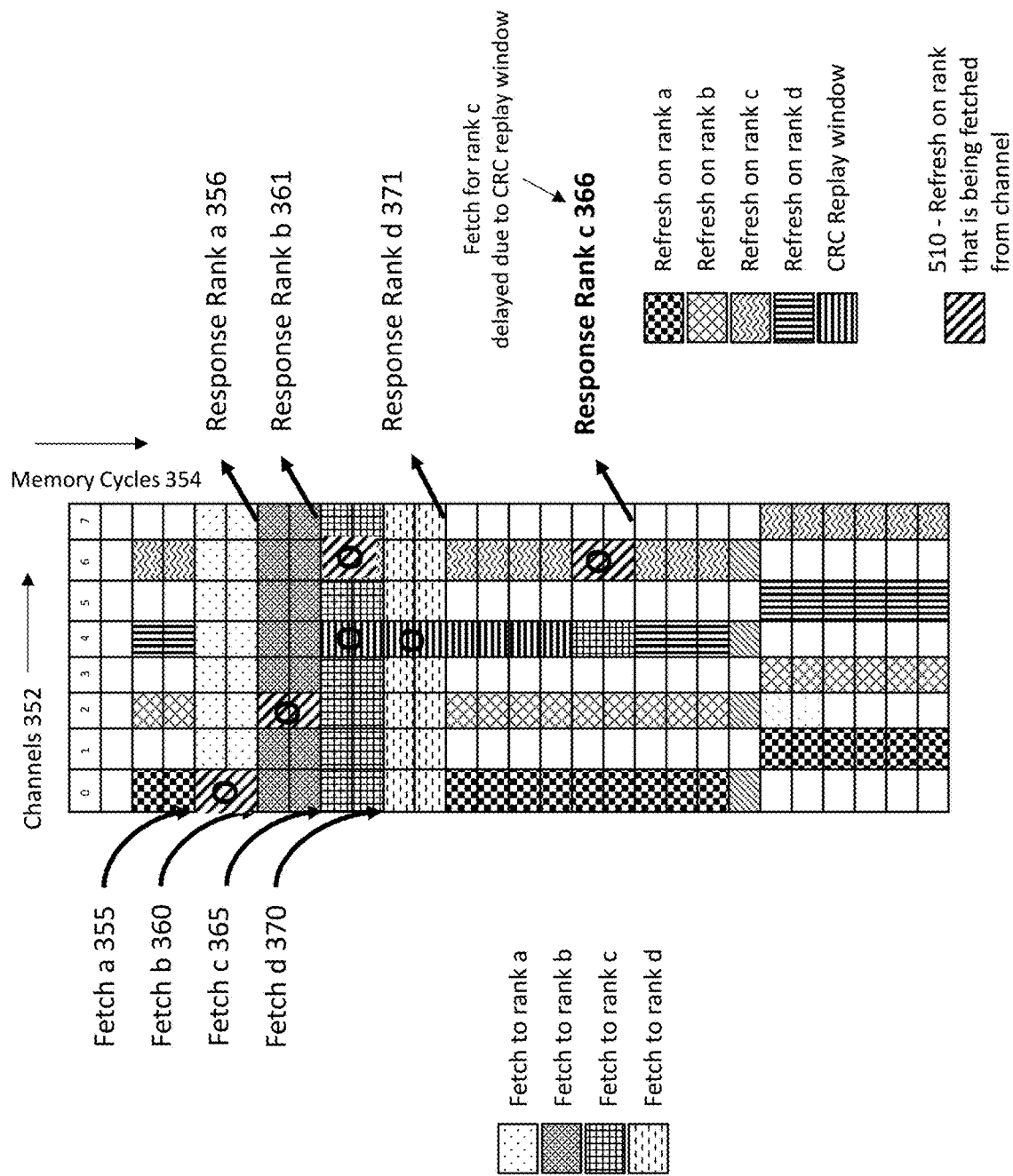
FIG. 6 depicts a visualization of memory cycles during a staggered refresh when a cyclic redundancy check (CRC) error occurs according to one or more embodiments of the present invention.

FIG. 6 depicts a visualization of memory cycles during a staggered refresh when a CRC error occurs according to one or more embodiments of the present invention. It should be noted that in FIG. 6 (and other figures depicting memory cycles), the refreshes are still occurring to the depicted ranks, and that FIG. 6 is only showing the fetch operations; the refreshes can be seen only during idle periods in FIG. 6. The memory cycles 354 during which the CRC error is determined are shown with a different shading, as shown in channel 4. Such a condition can occur, for example, when channel 4 experiences a temporary signaling failure. In the depicted case, fetch rank c 365 waits for the CRC window to expire and gets the data from the response rank c 366 late. Here, the fetch rank d 371 is unaffected, because channel 4 was already marked due to refresh of rank d in channel 4. Accordingly, none of the operations are retried, rather, they are only replayed/delayed.

Returning to FIG. 4, if a CRC error does not exist (block 420), a refresh channel mark is applied, at block 424, for the channel that is refreshing the fetched rank. It should be noted that because each channel is performing a refresh on distinct ranks, at most one channel from all of the channels (0-7) 352 would need a refresh channel mark. Accordingly, N−1 channels (in this case 7 channels of the 8 total channels) fetch data from the rank requested, and the Nth channel has an applied refresh channel mark for the data from the rank being refreshed.

In one or more embodiments of the present invention, the memory controller 102 returns data after N−1 channels return data, for example, when 7 of the 8 available channels 352 return respective data, without waiting for the data from the Nth channel. In this case, the memory controller 102 reconstructs the entire data using the data received from the N−1 channels, and without the data from the Nth channel. The Nth channel missing can be any of the channels 352. For example, data can be received from rank c from channels 0-5, and channel 7, with channel 6 being the missing Nth channel in this case. As noted, channel 6 data can be missing at the time the other 7 channels have data returned, because the rank c is being refreshed on channel 6. The RAIM channel mark is used to ignore data from the channel that is refreshing the fetched rank (denoted by '0' in FIG. 5). In an embodiment, once N−1 channels return data to the host, the host can proceed with the Nth channel marked, regardless of whether the host has any indication of which channels are refreshing or not.

The method further includes checking if any rank chip (DRAM) marks are required for the DRAM, at block 426. The DRAM marks can be applied regardless of whether there was a global mark, per rank channel mark, CRC error, or a refresh channel mark applied. If so, the DRAM marks are applied, at block 428. When DRAM marks are applied, similar to applying channel marks, the data from the marked DRAMs are ignored by the ECC code, thus strengthening the ECC code for more complete correction in light of untrusted parts. In an embodiment of the present invention, DRAM marks are applied based on a history of errors from a DRAM. In an embodiment of the present invention, scrub is run to clean up soft errors and to detect hard errors that repeat. In an embodiment of the present invention, scrub errors are tallied and compared to a threshold and a DRAM mark is applied to any DRAM above a certain threshold. In an embodiment of the present invention, graduated DRAM marking is applied which allows different levels of severity for different thresholds. This allows some marks for minor DRAM failures to later be used for more extreme DRAM failures that occur later on. DRAM marks are additional marking in the ECC code which allow a subset of a channel to be marked. In an embodiment, there are 10 DRAMs 204 used to fetch data from a given rank in a given channel. If there is a failed DRAM 204 in channel 2, rank c, then, after applying any channel marks, as indicated earlier, there can be an additional DRAM mark applied to channel 2, rank c, DRAM 3 (out of the DRAMs 0 to 9). In some embodiments of the present invention, there can be more than one independent DRAM mark, regardless of channel. In some embodiments of the present invention, there can be more than one independent DRAM mark within each rank. For example, there can be up to 2 DRAM marks, or 3 DRAM marks, or any other number of marks for each rank across the 8 channels (or any other number of channels).

In either case, with/without DRAM marks, the ECC for the fetched data is checked, at block 430. If the ECC capabilities, as specified in FIG. 2, are exceeded, the system identifies a UE, at block 408. Else, the fetched data is usable, for example, correct or with a correctable error. Accordingly, the data is corrected and returned as a result of the fetch command, at block 434. The corrected data can be with or without the DRAM marks (428) based on whether per rank marks are to be applied. In one or more embodiments of the present invention, the presence of a UE in block 408 can be corrected through a series of retries or other techniques. For example, some cases where there was a UE but CRC errors were present can be retried. In one or more embodiments of the present invention, the presence of the UE in block 408 results in the data being marked as unusable and the fetch command response indicating that such unusable data was received.

Figure 7:
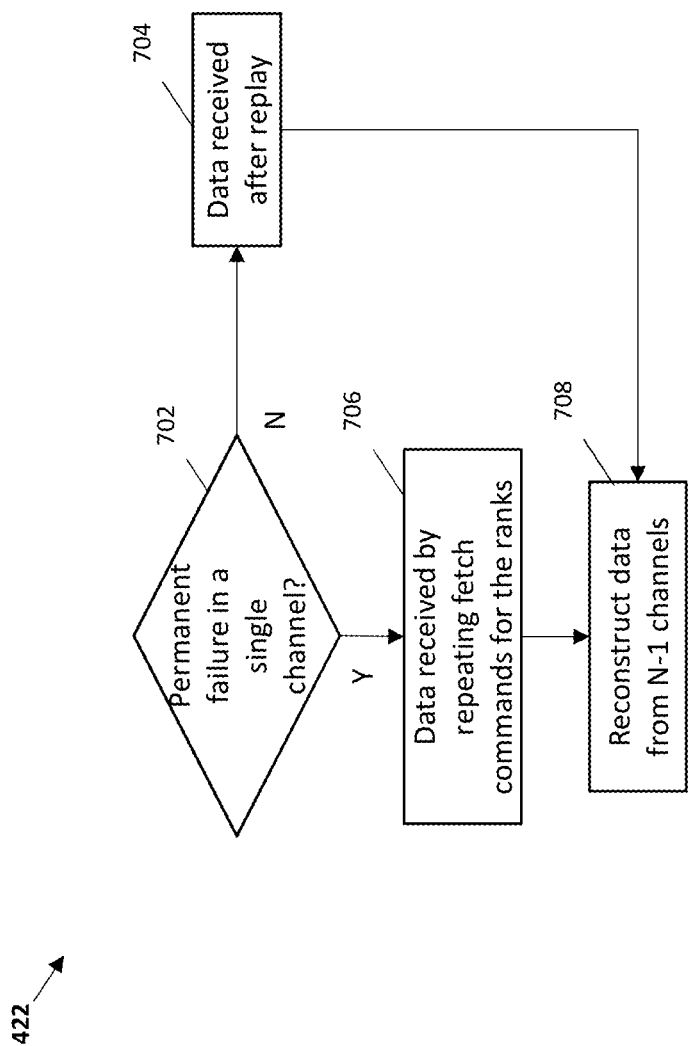
FIG. 7 depicts a flowchart for a method for performing the replay for a staggered refresh memory system according to one or more embodiments of the present invention.

FIG. 7 depicts a flowchart for a method for performing the replay for a staggered refresh memory system according to one or more embodiments of the present invention. As described earlier, the method waits for a replay if a CRC error is encountered after data is fetched (FIG. 4, block 422). In one or more examples, the method includes checking if the CRC error is caused by a permanent channel failure in one or more of the channels 352, at block 702. If the CRC error is not caused by a permanent failure, the data is received after the replay is performed, at block 704. In this case, the method continues as depicted in FIG. 4.

Figure 8:
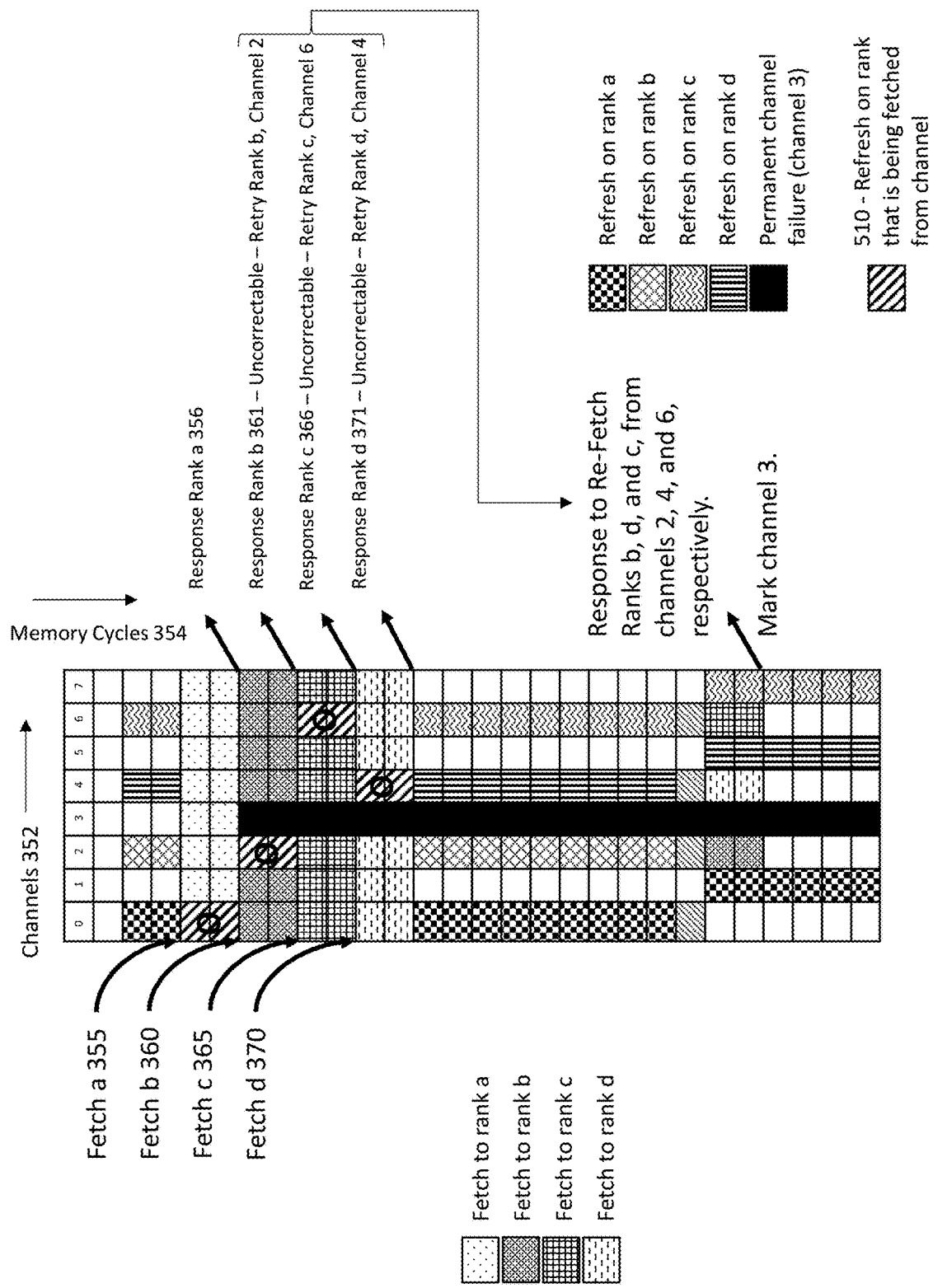
FIG. 8 depicts a visualization of memory cycles for an example scenario during a staggered refresh when a CRC error occurs according to one or more embodiments of the present invention.

In the case that a permanent failure detected for a single channel results in a UE, the method repeats the fetch commands for the channels that were obtained since the UE is encountered, at block 706. In an embodiment of the present invention, the method performs a fetch to the channel that was blocked in step 418. The recovery uses one fetch command to use the RAIM to obtain the missing channel that causes the CRC error. FIG. 8 depicts a visualization of memory cycles for an example scenario during a staggered refresh when a CRC error occurs according to one or more embodiments of the present invention. Here, channel 3 experiences a permanent failure at a particular memory cycle shown with different shading. Accordingly, the data fetch can receive data only from N−2 channels (in this case 6 channels), because one of the channels 352 is being refreshed (channel 2 for a rank b fetch, channel 6 for a rank c fetch, and channel 4 for a rank d fetch), and one of the channels 352 channel 3 has failed. Hence, the data cannot be reconstructed using the available data (N−2) channels, for any of those three ranks being fetched.

Referring to the flowchart in FIG. 7, the method includes refetching the ranks of data that were accessed since the UE was encountered, the refetch command issued to the same channels from which the data was requested initially. In the depicted example of FIG. 8, fetch rank b 320, fetch rank c 330, and fetch rank d 340, are repeated, and corresponding responses are obtained after refresh cycles of those ranks are completed on the channels, 2, 6, and 4, respectively. The memory controller 102 can now reconstruct the entire data despite the original UE encountered by one of the channels 352, in this case, channel 3, at block 708. Embodiments of the present invention may re-fetch all the missing channels simultaneously (as shown in FIG. 8) or in a staggered fashion, over time. In one or more embodiments of the present invention, once the replay is complete, the method 422 reconstructs data from N−1 channels.

Figure 9:
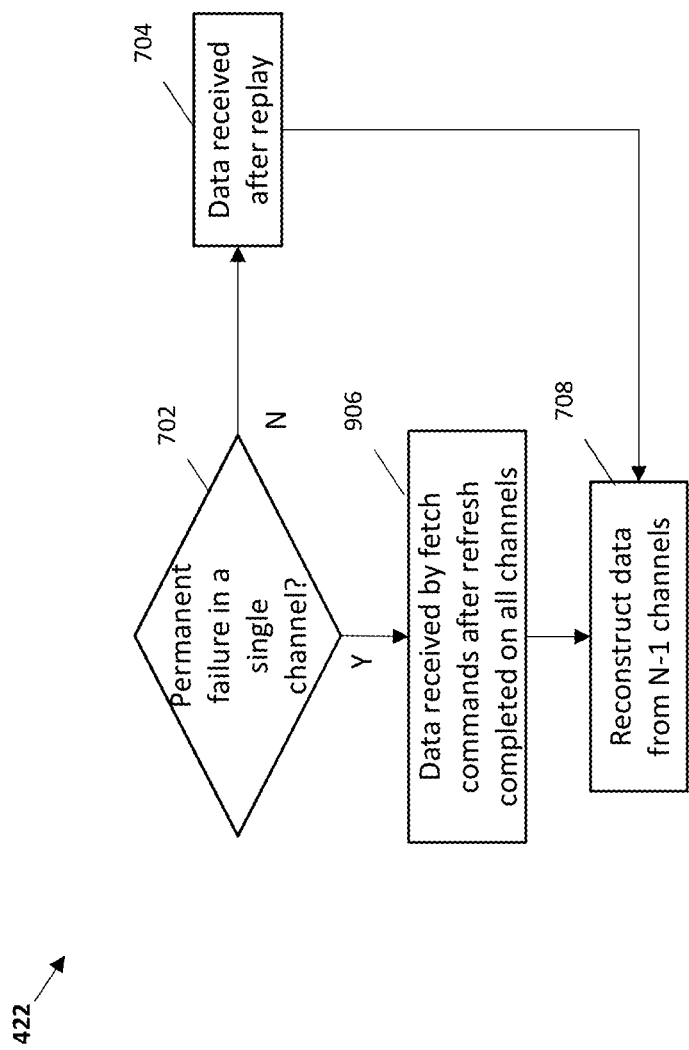
FIG. 9 depicts a flowchart for a method for performing the replay for a staggered refresh memory system according to one or more embodiments of the present invention.

FIG. 9 depicts a flowchart for a method for performing the replay for a staggered refresh memory system according to one or more embodiments of the present invention. As described earlier, the method waits for a replay if a CRC error is encountered after data is fetched (FIG. 4, block 422). In one or more examples, the method includes checking if the CRC error is caused by a permanent channel failure in one or more of the channels 352, at block 702. If the CRC error is not caused by a permanent failure, the data is received after the replay is performed, at block 704. In this case, the method continues as depicted in FIG. 4.

Figure 10:
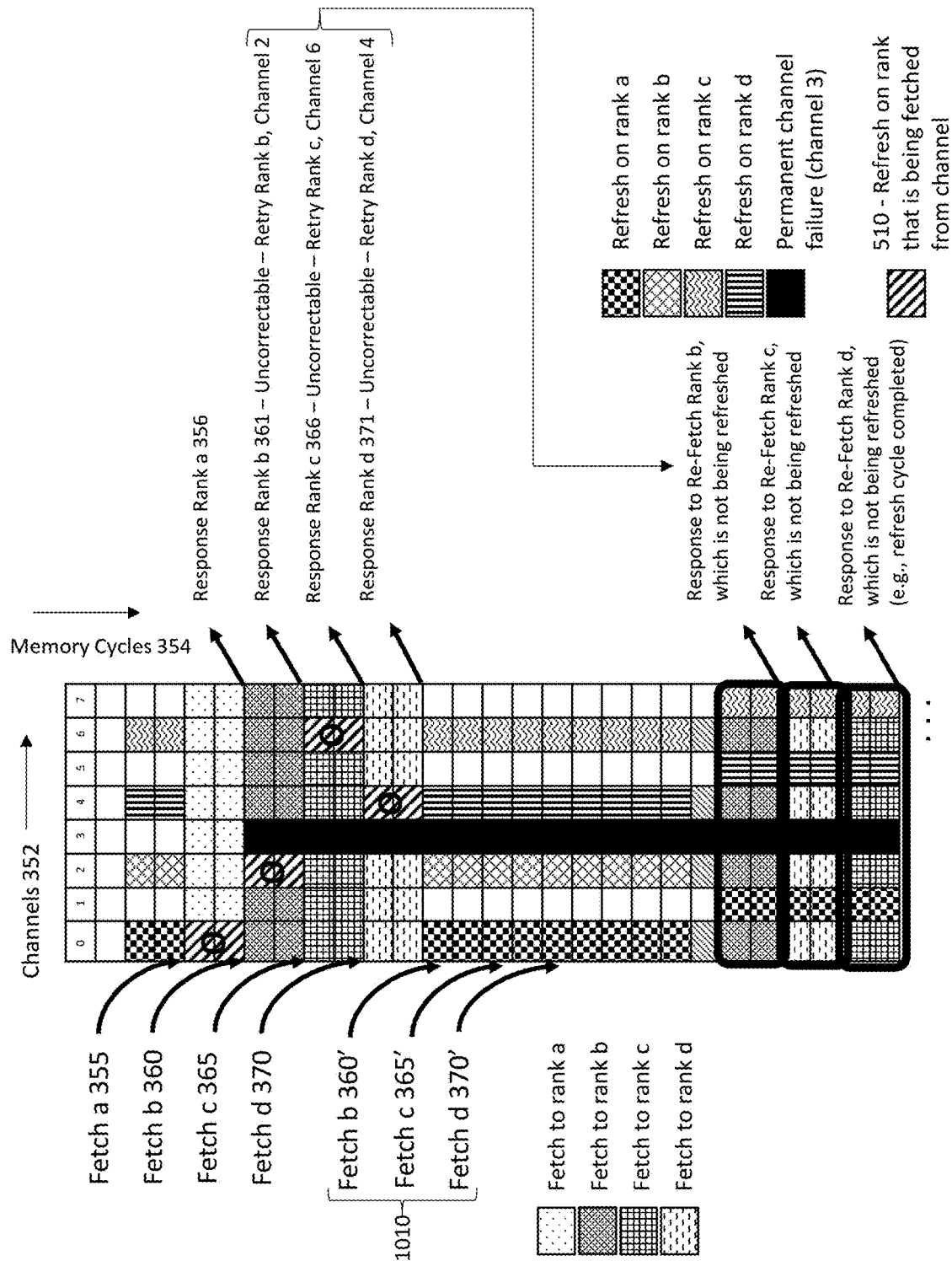
FIG. 10 depicts a visualization of memory cycles for an example scenario during a staggered refresh when a CRC error occurs according to one or more embodiments of the present invention.

In the case that a permanent failure detected is a UE for a single channel, the method initiates fetch commands for the ranks that were obtained since the UE is encountered after refresh cycles are completed across all channels 352, at block 906. Here, recovery uses all fetches (eight) to use RAIM to obtain the missing channel. FIG. 10 depicts a visualization of memory cycles for an example scenario during a staggered refresh when a CRC error occurs according to one or more embodiments of the present invention. Here, channel 3 experiences a permanent failure at a particular memory cycle shown with different shading. Accordingly, the data fetch can receive data only from N−2 channels (in this case 6 channels), because one of the channels is being refreshed (channel 2 for a rank b fetch, channel 6 for a rank c fetch, and channel 4 for a rank d fetch), and one of the channels 352 channel 3 has failed. Hence, the data cannot be reconstructed using the available data (N−2) channels.

Referring to the flowchart in FIG. 9, the method includes refetching the ranks of data that were accessed since the UE was encountered, the refetch command issued after refresh is completed across all the channels 352. All the channels 352 are disabled while the refresh cycles are completing in this case. Accordingly, once the refresh cycles are completed, the refetch commands obtain the data from the corresponding channels (in this case channel 2 for rank b, channel 6 for rank c, and channel 4 for rank d). The memory controller 102 is able to reconstruct the entire data once the refetch is performed using the data from N−1 channels, at block 708. Further, if additional fetch commands 1010 to the ranks b, c, and/or d are received, they can be completed across all but the channel with the permanent failure, channel 3 in the ongoing example of FIG. 10. The additional fetch commands 1010 can be completed sooner on the channels 352 other than those that are refreshing and/or refetching. For example, in the example scenario of FIG. 10, the three channels 2, 4, and 6, that have refetch from the initial fetch commands respond late for the additional fetch commands 1010. The remaining channels (1, 3, 5, and 7) respond sooner, because there are no conflicts with refresh and/or refetch.

Fetch commands from N−1 channels is based on a refresh model of the memory controller 110. In one or more examples, the fetch from the N−1 channels is based on a refresh sync status protocol in which the buffer chip 220 sends rank information upstream. In one or more examples, the model is based on an exchange of information between the memory controller 110 and the buffer chip 220. In an embodiment, the buffer chip 220 sends a control command to memory controller 110 indicating that a new rank is being refreshed. That rank helps the memory controller 110 to track the current rank being refreshed by each channel. In an embodiment, the memory controller 110 sends a downstream control command to the buffer chip 220 to indicate the next rank to be refreshed, once the prior rank is done refreshing.

While embodiments of the present invention are shown indicating replay recovery on a single channel, other embodiments include additional forms of recovery, including recalibration, re-initialization, periodic calibration, tuning, etc. These are not described, but can be implemented by anyone skilled in the art of interface calibration and management. Embodiments of the present invention also facilitate the memory controller sending out an 'align all channels to sync pulse' in order to align refreshing of each rank across all channels (i.e. disable staggered refresh) for when there is a permanent channel degrade. Once there is a channel degrade, a re-synchronization of all channels to the same rank might provide better performance than using the staggered refresh with a degraded channel.

Embodiments of the present invention facilitate aligning refreshes for a given rank across multiple channels in a memory system so that the penalties for the refreshes for the different channels are limited to a small window. The penalties are limited because the latencies of the refresh across the multiple channels are hidden because the data is released to the memory controller using the channel mark in order to save latency associated with a refresh penalty that is normally incurred on a fetch to a rank that has a refresh pending.

Embodiments of the present invention have staggered refresh within subsets of a rank such that enough data can be obtained in the rank, with ECC protection/correction, to allow for the complete logical data in the rank to be fetched without penalty. Embodiments of the present invention accordingly facilitate accessing every piece of logical data (using data correction) without incurring a refresh penalty, since it can reconstruct the data that is refreshing using the RAIM redundancy data. Accordingly, one or more embodiments of the present invention address the technical challenge of reducing latency by taking advantage of RAIM, ECC, or other marking techniques.

In addition to refresh penalties, a degradation in bandwidth of a channel can be experienced by the memory subsystem. In one or more examples, low connector reliability can lead to interface pins of a DRAM 204 failing. Other reasons can lead to a degradation of bandwidth of a channel 352. Lane degradations (e.g. running a bus that carries 2 lanes in each memory cycle instead of 4 lanes) reduces bandwidth and increases latency, thus adversely affects memory performance. Existing solutions to overcome such bandwidth degradation include spare lanes on the memory subsystems, the spare lanes used in case of a lane experiencing a degradation. However, a spare lane uses more chip I/O, increases costs, and uses more power. For instance, with a memory channel that has ×4 plus a spare, there would be five lanes implemented to support a ×4 logical interface. That is 25% more data wires. For most cases, these wires are not used, since they are spares, only used for the cases where a lane failed. Eliminating spare lanes, without some other innovation or mitigation, results in the memory hardware being replaced on a first encountered error, which again is cost prohibitive and affects system availability, particularly in large enterprise systems. Embodiments of the present invention address such technical challenges and facilitate maintaining the bandwidth of the memory subsystem even with one or more channels being degraded.

Further, the technical solutions provided by embodiments of the present invention facilitate a RAIM system to continue operation even in the case of a slowdown (degradation) of a channel (interface). Further, if a separate (second) channel experiences a failure, which may be unrepairable, the RAIM system, in accordance with the invention, can continue operation using the degraded channel, albeit at an increased latency.

Figure 11:
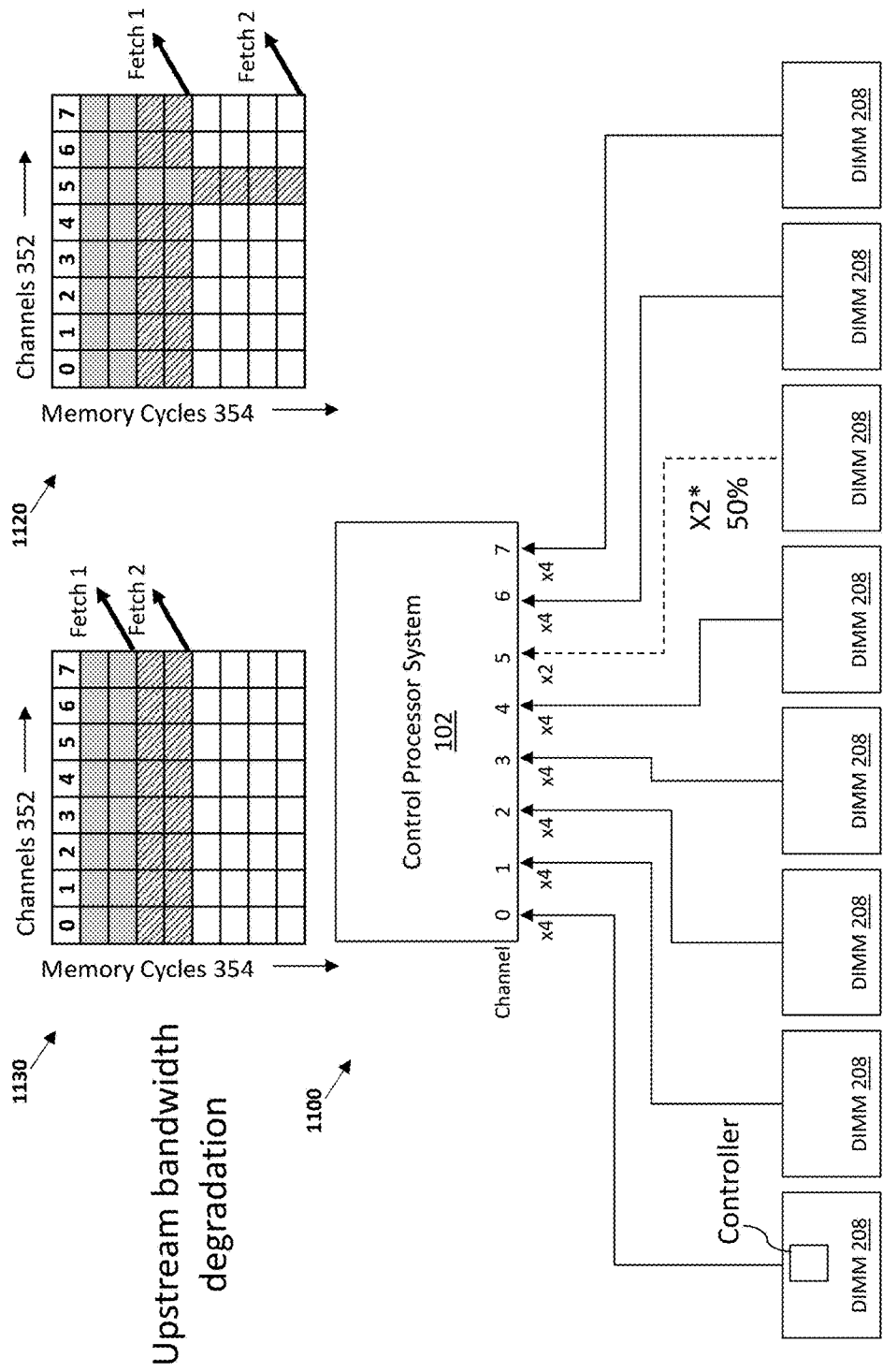
FIG. 11 depicts an example RAIM system according to one or more embodiments of the present invention.

FIG. 11 depicts an example RAIM system according to one or more embodiments of the present invention. The RAIM system 1100 includes the control processor system 102 connected to an 8-channel RAIM with differential DIMMs 208. It is understood that in other embodiments of the invention the system 1100 can include a different number of DIMMs 208. Here, each DIMM 208 is configured to operate at a bandwidth ×4, i.e. 4 lanes are sent upstream to the control processor system 102 in each fetch response. It is understood that in other embodiments of the invention, the bandwidth can be configured differently, for example, 8 lanes per fetch, 16 lanes per fetch, 2 lanes per fetch, etc. In this particular example scenario, the channel 5 experiences an error that causes that channel to operate at a degraded bandwidth of ×2, in this case, half of the configured (×4) bandwidth. It is understood that any of the channels 0-7 352 can experience the degradation in other cases.

As shown in the timing diagram 1130, the bandwidth of all 8 channels 352 are the same (assuming a ×4 upstream fetch interface for each channel, not shown). This is represented as 2 memory cycles 354 to complete fetch 1 and 2 additional memory cycles 354 to complete fetch 2.

As shown in the timing diagram 1120, the degraded bandwidth of channel 5 (e.g. from ×4 to ×2) causes the depicted data fetch operations to take 2 times longer (4 memory cycles 354 for fetch 1 and 4 more memory cycles 354 for fetch 2, for a total of 8 memory cycles) than the expected time of a memory system that has no degrades 1130 (4 memory cycles). Additional data fetch operations will experience a similar delay as the delay caused by the bandwidth degradation (i.e. the delays tend to be cumulative). This can be seen in 1120, where the 4 memory cycles 354 that it would normally take to complete the fetch (as shown in 1130) are shown as 8 memory cycles 354 in 1120.

Figure 12:
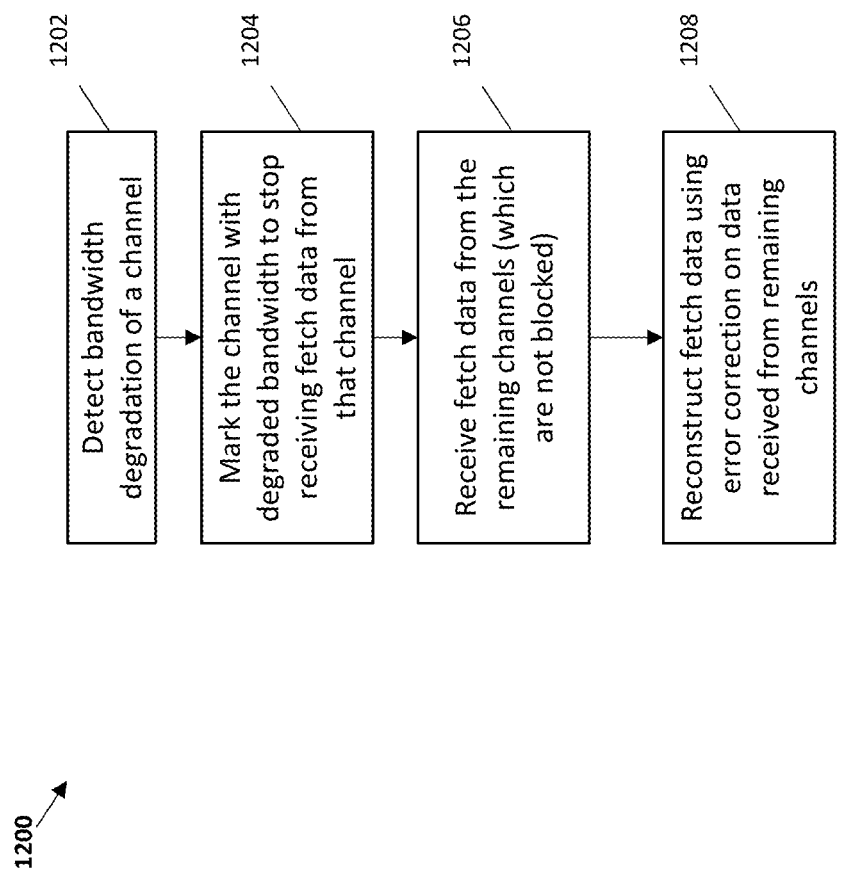
FIG. 12 depicts a flowchart of a method for operating the memory system with a degraded channel according to one or more embodiments of the present invention.

FIG. 12 depicts a flowchart of a method for operating the memory system with a degraded channel according to one or more embodiments of the present invention. The method 1200 includes detecting that one of the channels, in this example channel 5, has a degraded bandwidth, at 1202. The detection can be based on an amount of time required for the fetch data to be received by the control processor system 102 in response to a fetch command. In one or more embodiments of the present invention, bandwidth detection could be the result of a degrade action (e.g. a repeated CRC error 406, 412, 413, or 420 or an interface degrade error indicating that a ×4 to ×2 degrade has occurred). In one or more embodiments of the present invention, a bandwidth test may be conducted periodically to check the status of each channel.

The method further includes marking, by the control processor system 102, the channel with degraded bandwidth as unavailable to stop providing fetch data, at block 1204. In other words, any data from the marked channel is ignored in the correction of fetch data. Accordingly, in this case, fetch data is treated in an equivalent way, as if the data were not received via channel 5. The channel with degraded bandwidth is marked with a CE in one or more embodiments of the present invention.

Further, the method includes receiving, by the control processor system 102, fetch data from the remaining channels in the system 1100. Once data is received from the remaining channels 1206, in this example channels 0-4 and channels 6-7, the control processor system 102 reconstructs the data using error correction, at block 1208.

Figure 13:
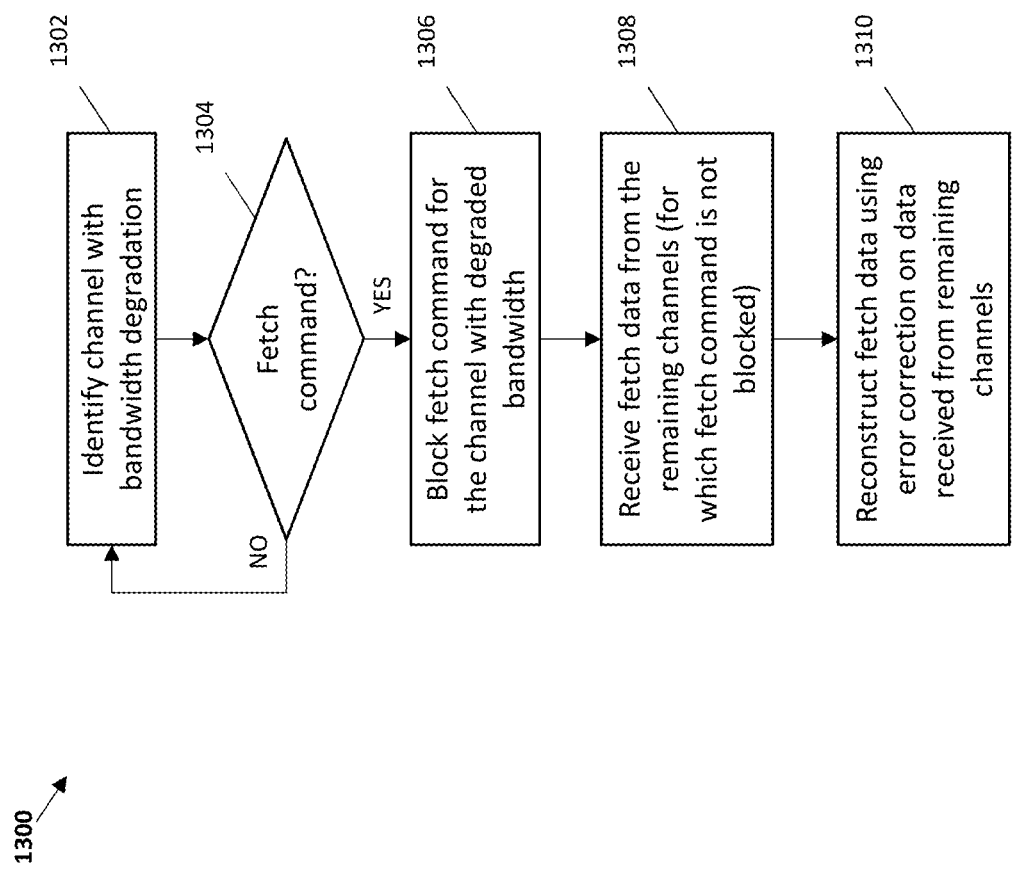
FIG. 13 depicts a flowchart of a method for operating the memory system with a degraded channel according to one or more embodiments of the present invention.

FIG. 13 depicts a flowchart of a method for operating the memory system with a degraded channel according to one or more embodiments of the present invention. According to one or more embodiments of the present invention, the method 1300 is used for continuing to operate the RAIM system 1100 despite the degraded bandwidth of a channel. In this method 1300, the channel, for example, the channel 5, is identified to have a degraded bandwidth, at block 1302. The degradation can be detected based on a periodic testing and/or based on an amount of time required to receive a fetch data in response to a fetch command. In one or more embodiments of the present invention, bandwidth detection could be the result of a degrade action (e.g. a repeated CRC error 406, 412, 413, or 420 or an interface degrade error indicating that a ×4 to ×2 degrade has occurred).

Further, in response to receipt of a fetch command, the control processor system 102 blocks the fetch command for the identified channel with the degraded bandwidth, at blocks 1304, 1306. Accordingly, in the ongoing example scenario, channel 5 does not receive the fetch command. The control processor system 102, subsequently, receives fetch data from the remaining channels in the system, i.e., from channels 0-4, and 6-7, at block 1308. The method 1300 includes reconstructing the fetch data using error correction over the fetch data received from the remaining channels, at block 1310.

Figure 14:
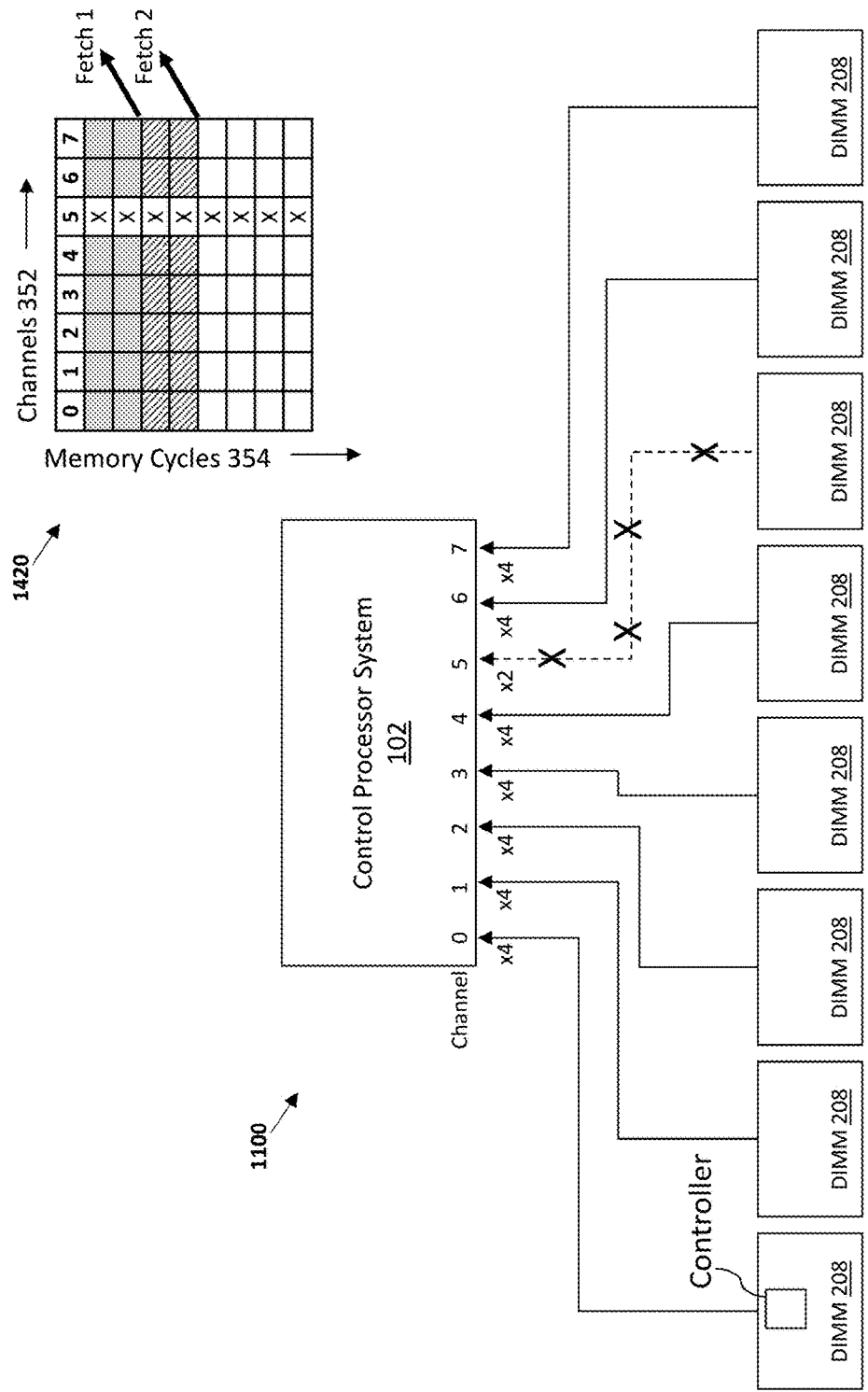
FIG. 14 depicts an operational block diagram of a RAIM system operating despite the channel with degraded bandwidth according to one or more embodiments of the present invention.

FIG. 14 depicts an operational block diagram of the RAIM system 1100 operating despite the channel with degraded bandwidth according to one or more embodiments of the present invention. Here, the channel that is considered as the channel with degraded bandwidth, channel 5, is blocked using one or more techniques described herein. Accordingly, the control processor system 102 receives fetch data only from the DIMMs 208 on the channels 0-4, and 6-7. As shown in the timing diagram 1420, the resulting fetch operations complete at the configured bandwidth (×4), without a loss in latency. It should be noted that the bandwidth degradation causes an increase in latency for transferring the data. Accordingly, embodiments of the present invention can be described in terms of latency degradation instead of bandwidth degradation.

Figure 15:
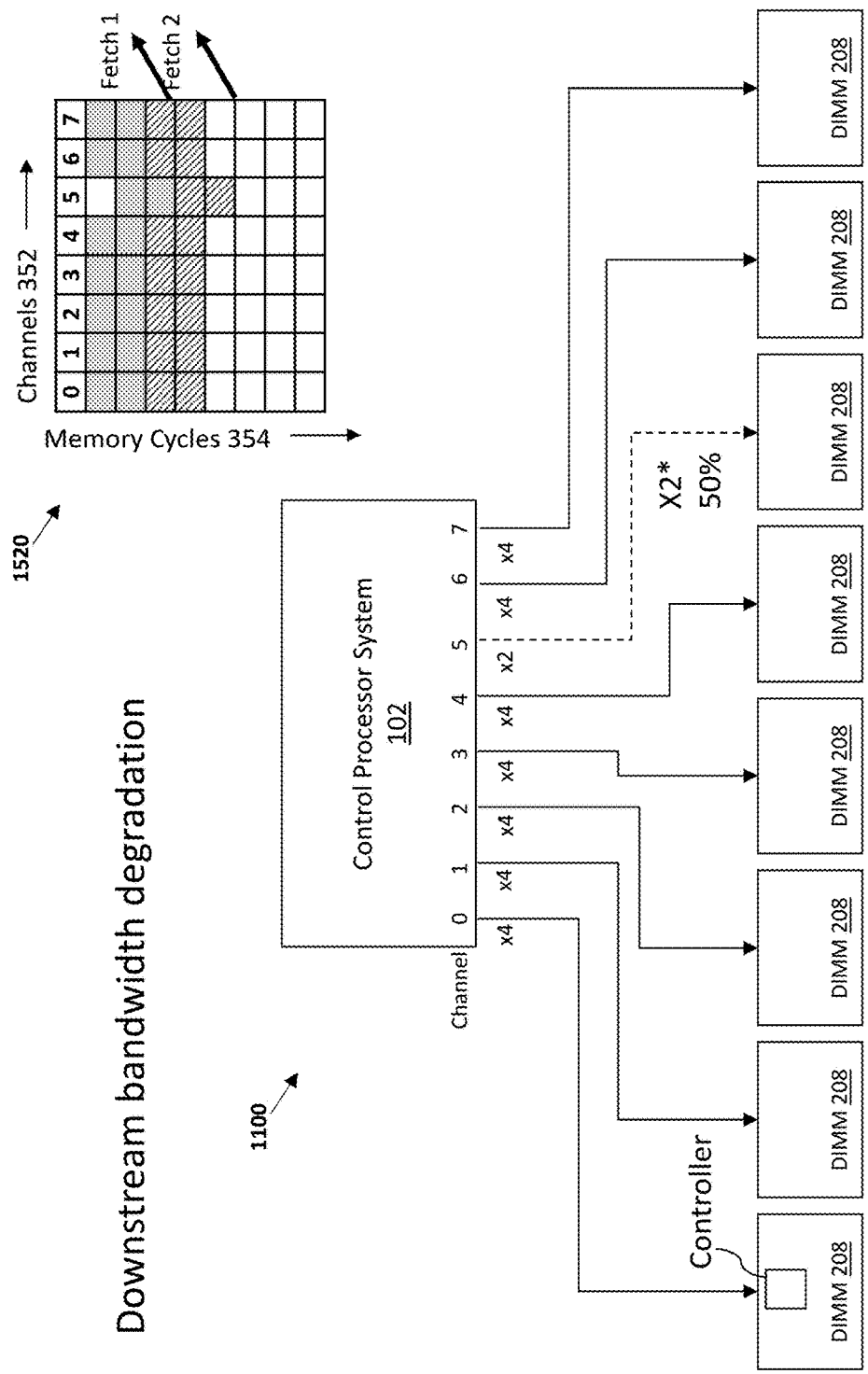
FIG. 15 depicts an example RAIM system with downstream bandwidth degradation in a channel according to one or more embodiments of the present invention.

In one or more embodiments of the present invention, the bandwidth degradation may be experienced by the channel only during a downstream operation, i.e., when a fetch command is sent by the control processor system 102 to the DIMMs 208. FIG. 15 depicts an example RAIM system with downstream bandwidth degradation in a channel according to one or more embodiments of the present invention. Again, consider that channel 5 experiences a downstream channel bandwidth degradation. In such a case, the fetch command (not data) can be delayed, causing a fetch data delay on the channel 5. The timing diagram 1520 depicts the delay caused according to one or more examples. Because more than one fetch commands can be packed together, fetch data delay due to fetch command delay is not necessarily cumulative. As shown in timing diagram 1520, the fetch 1 and fetch 2 data arrive later than they would normally arrive in 1130. However, they are not as late as they would arrive in 1120.

The degraded channel, for example channel 5, can be marked or the fetch command for that channel can be blocked as described herein to facilitate the RAIM system 1100 to continue to operate without a loss in latency in case of the degradation in the downstream bandwidth as well.

It should be noted that embodiments of the present invention can be applied regardless of the type(s) of interfaces used for the RAIM system. For example, the interfaces can be connected using direct interface, riser card type interface, uni-direction, bi-directional, inband with out-of-band backup, differential, single-ended, or any other configuration. Further, the RAS structure can also be varied without affecting the application of the technical solutions provided by one or more embodiments of the present invention. For example, the RAS structure can use RAIM, mirror, ECC, multi-port or any other architecture. Also, it is understood that the number of channels/ports and the bandwidth values described in the examples can vary in one or more embodiments of the present invention.

Figure 16:
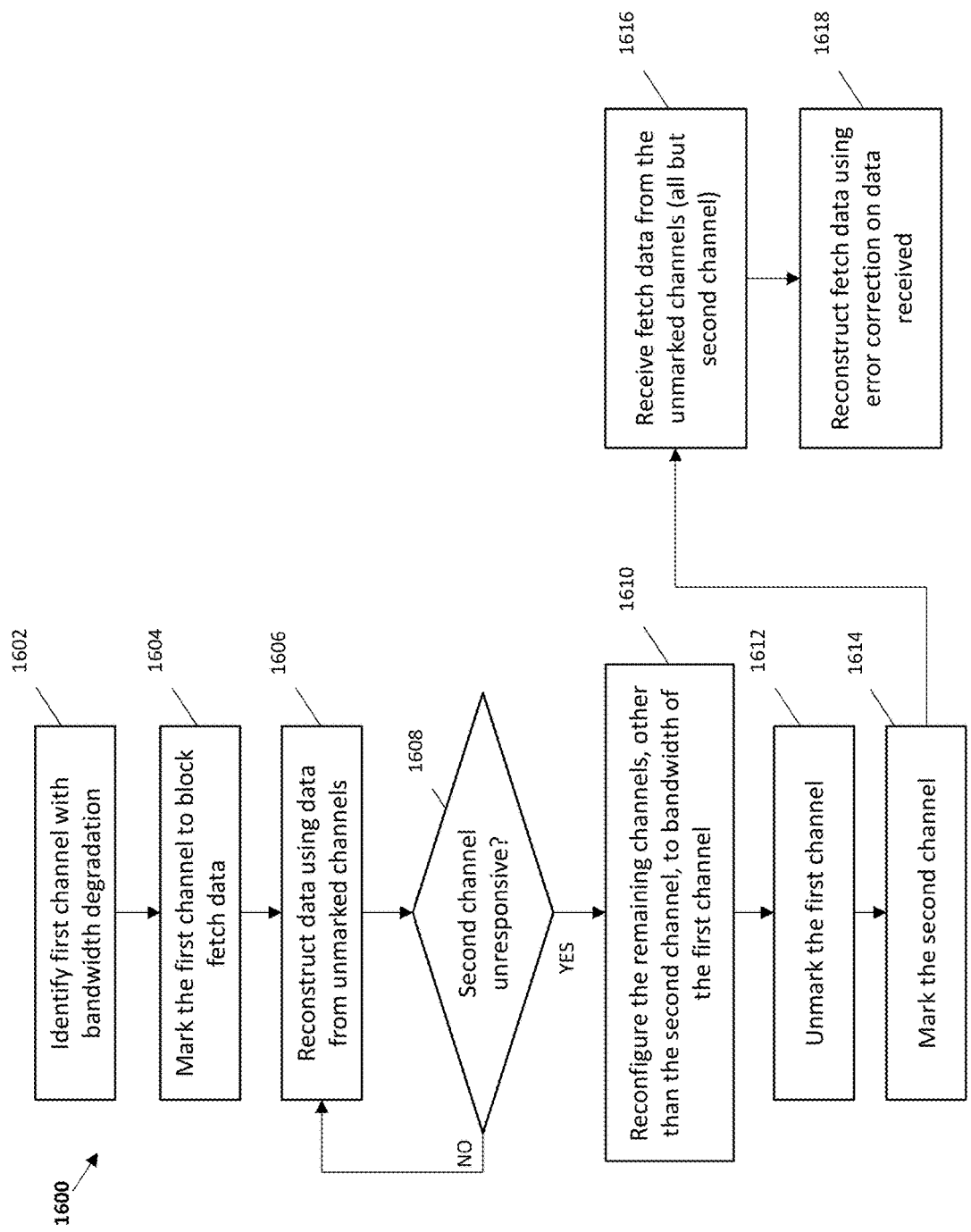
FIG. 16 depicts a flowchart of a method for operating a RAIM system despite a channel with degraded bandwidth and another unresponsive channel according to one or more embodiments of the present invention.

FIG. 16 depicts a flowchart of a method for operating a RAIM system despite a channel with degraded bandwidth and another unresponsive channel according to one or more embodiments of the present invention. The method 1600 depicted here includes identifying a first channel, say channel 5, that has a degraded bandwidth, at block 1602. The first channel is marked as unavailable for preventing fetch data from that first channel, at block 1604. For example, as described herein, the first channel is marked as CE, or the fetch command is blocked from the first channel. The method 1600 now includes reconstructing data using the remaining unmarked channels, at block 1606, as described herein.

The method 1600 continues in this manner until a second channel, say channel 7, is identified to experience unresponsiveness, at block 1608. For example, channel 7 can experience an uncorrectable error. In such cases, the second channel is blocked permanently (fenced). In an embodiment, the applying of a mark to a channel can occur dynamically on a fetch-by-fetch basis. This may be advantageous when combined with staggered memory refresh as described earlier. For example, there may be cases where a degraded channel still provides data earlier than another channel that currently has a rank being refreshed for a particular fetch to that rank. In this case, a decision is made to apply a channel mark to the latest channel N, regardless of whether or not it is a degraded channel versus a channel with a rank currently being refreshed.

Upon experiencing the unresponsive second channel, the method 1600 includes configuring the remaining channels, other than the second channel, to the degraded bandwidth at which the first channel is operating, at block 1610. For example, if the first channel, channel 5, is operable at the degraded bandwidth of ×2, the channels 0-4, and 6 (channels other than the second channel, channel 7) are reconfigured to match the degraded bandwidth of ×2.

Further, the method 1600 includes unmarking the first channel, at block 1612, so that the first channel can now participate in fetching data. Further, the method includes marking the second channel block to prevent the second channel from participating in fetching data, at block 1614. For example, the second channel can be blocked. Alternatively, or in addition, the fetch command is not provided to the second channel.

The method 1600, further includes fetching data from all the channels except from the second channel, at block 1616. Further, the fetch data is reconstructed using the data from the channels other than the second channel using error correction, at block 1618.

Figure 17:
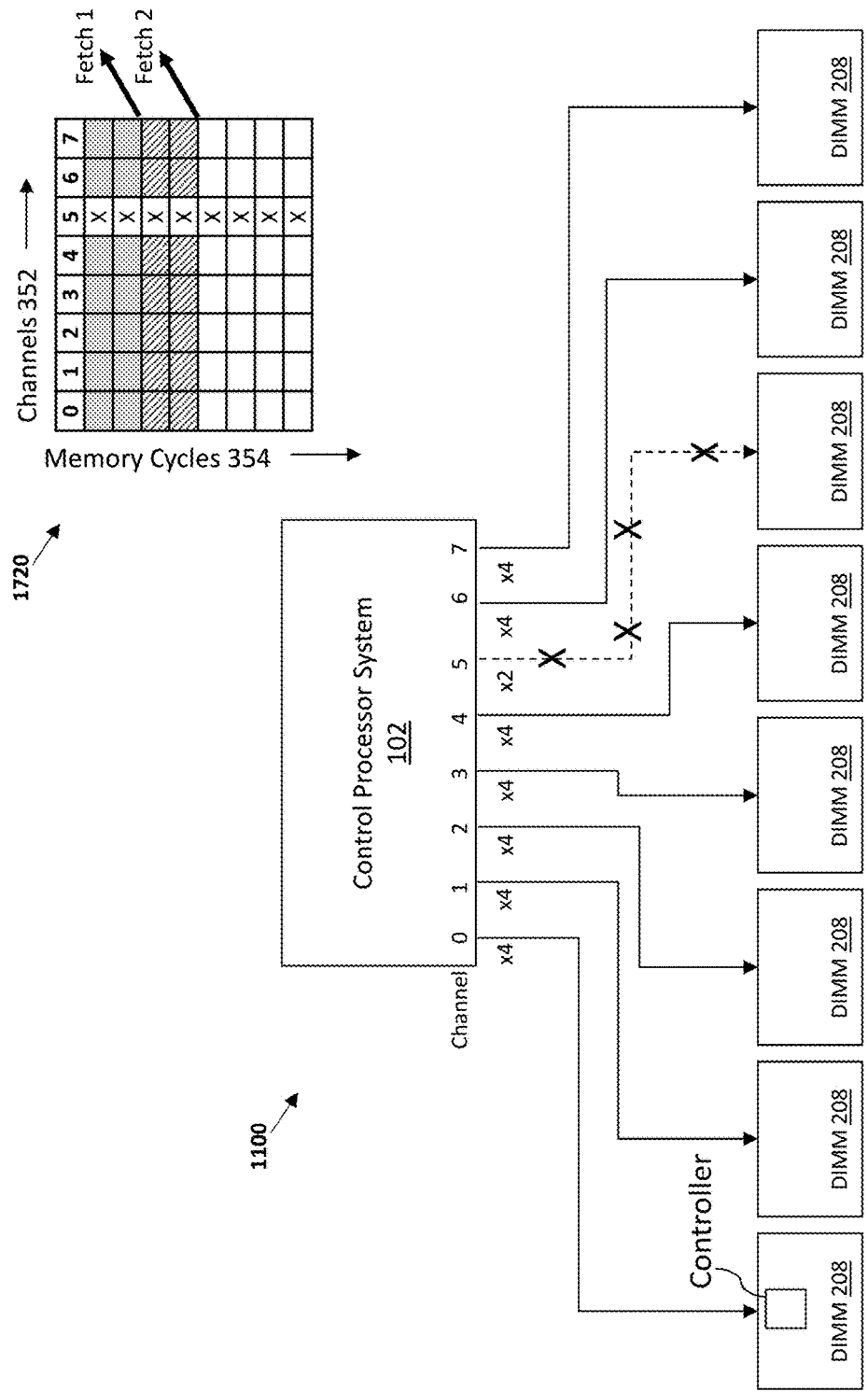
FIG. 17 depicts an operational block diagram of a RAIM system operating despite a channel with degraded bandwidth according to one or more embodiments of the present invention.

FIG. 17 depicts an operational block diagram of the RAIM system 1100 operating despite the channel with degraded bandwidth according to one or more embodiments of the present invention. Here, the channel that is considered as the channel with degraded bandwidth, channel 5, is blocked using one or more techniques described herein. Accordingly, the control processor system 102 receives fetch data only from the DIMMs 208 on the channels 0-4, and 6-7. As shown in the timing diagram 1720, the resulting fetch operations complete at the configured bandwidth (×4), without a loss in latency.

Accordingly, one or more embodiments of the present invention facilitate operating a memory system, such as a RAIM system, in a low-latency interface-degraded configuration, where an immediate hardware change is not necessitated. Although, a loss in latency may be experienced, the memory system continues to operate, which can be critical for enterprise systems that are to have at least a certain uptime, a high availability. Accordingly, embodiments of the present invention provide an improvement to computing technology by improving the memory system to have a higher availability. Further, embodiments of the present invention, accordingly, provide a practical application of keeping a high availability enterprise system, such as a server or any other machine, operable despite experiencing a memory system error(s).

In one or more examples, when the system combines staggered refresh with the degraded channel improvements described herein, (or just degrade without stagger) the system can suppress fetches on the degraded channel (to lower its bandwidth requirement). Further, in such cases, the system can retry fetches only when there was another channel failure, so that the slower, i.e. degraded, channel does not fall behind on stores or other activity.

The present invention may be a system, a method, and/or a computer program product at any possible technical detail level of integration. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, configuration data for integrated circuitry, or either source-code or object code written in any combination of one or more programming languages, including an object-oriented programming language such as Smalltalk, C++, or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instruction by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
    refreshing a plurality of memory channels in a memory system in parallel, each memory channel connects a respective memory module to a memory controller, and wherein the each memory channel comprises a plurality of ranks, each rank representing a memory device of the memory module, and wherein refreshing the plurality of memory channels in parallel comprises refreshing a first rank a of a first memory channel from the plurality of memory channels and rank b of a second memory channel from the plurality of memory channels; and
    marking the first memory channel from the plurality of memory channels as being unavailable for the rank a being refreshed in the first memory channel.

2. The computer-implemented method of claim 1, further comprising blocking a fetch command to the first memory channel for the rank a being refreshed in the first memory channel.

3. The computer-implemented method of claim 2, wherein in response to the fetch command being blocked and an error in a third memory channel that is different from the first memory channel, the fetch command is repeated for the third rank being refreshed in the third memory channel.

4. The computer-implemented method of claim 2, further comprising:
    receiving data from N−1 memory channels of N memory channels in the plurality of memory channels, N being an integer greater than 1; and
    reconstructing fetch data using the data received from the N−1 memory channels.

5. The computer-implemented method of claim 4, further comprising, in response to an error during reconstructing the fetch data, reissuing the fetch command to the first memory channel for the rank a being refreshed in the first memory channel.

6. The computer-implemented method of claim 4, further comprising, in response to an error during reconstructing the fetch data, reissuing the fetch command to all of the available memory channels for the rank a.

7. The computer-implemented method of claim 1, wherein the memory system is a redundant array of independent memory (RAIM) error correcting code memory system.

8. A system comprising:
    a memory system comprising a plurality of memory channels; and
    a memory controller communicatively coupled with the memory system, the memory controller configured to perform a method comprising:
        refreshing the plurality of memory channels in the memory system in parallel, wherein each memory channel comprises a plurality of ranks, and wherein refreshing the plurality of memory channels in parallel comprises refreshing rank a of a first memory channel from the plurality of memory channels and rank b of a second memory channel from the plurality of memory channels; and
        marking the first memory channel from the plurality of memory channels as being unavailable for the rank a being refreshed in the first memory channel.

9. The system of claim 8, further comprising blocking a fetch command to the first memory channel for the rank a being refreshed in the first memory channel.

10. The system of claim 9, wherein in response to the fetch command being blocked and an uncorrectable error in a third memory channel that is different from the first memory channel, the fetch command is repeated for the third rank being refreshed in the third memory channel.

11. The system of claim 9, wherein the method further comprises:
receiving data from N−1 memory channels of N memory channels in the plurality of memory channels, N being an integer greater than 1; and
reconstructing fetch data using the data received from the N−1 memory channels.

12. The system of claim 11, wherein the method further comprises, in response to an error during reconstructing the fetch data, reissuing the fetch command to the first memory channel for the rank a.

13. The system of claim 11, wherein the method further comprises, in response to an error during reconstructing the fetch data, reissuing the fetch command to all of the available memory channels for the rank a being refreshed in the first memory channel.

14. The system of claim 8, wherein a mark for the memory channel can include an indication of a correctable error check or of an uncorrectable error check.

15. A computer program product comprising a computer-readable storage medium having program instructions embodied therewith, the program instructions when executed by a processor cause the processor to perform a method comprising:
refreshing a plurality of memory channels in a memory system in parallel, wherein each memory channel comprises a plurality of ranks, and wherein refreshing the plurality of memory channels in parallel comprises refreshing rank a of a first memory channel from the plurality of memory channels and rank b of a second memory channel from the plurality of memory channels; and
marking the first memory channel from the plurality of memory channels as being unavailable for the rank a being refreshed in the first memory channel.

16. The computer program product of claim 15, further comprising blocking a fetch command to the memory channel for the rank a being refreshed in the first memory channel.

17. The computer program product of claim 16, wherein in response to the fetch command being blocked and an uncorrectable error in a third memory channel that is different from the first memory channel, the fetch command is repeated for the third rank being refreshed in the third memory channel.

18. The computer program product of claim 16, wherein the method further comprises:
receiving data from N−1 memory channels of N memory channels in the plurality of memory channels, N being an integer greater than 1; and
reconstructing fetch data using the data received from the N−1 memory channels.

19. The computer program product of claim 18, wherein the method further comprises, in response to an error during reconstructing the fetch data, reissuing the fetch command to the first memory channel for the rank a being refreshed in the first memory channel.

20. The computer program product of claim 18, wherein the method further comprises, in response to an error during reconstructing the fetch data, reissuing the fetch command to all of the available memory channels for the rank a.

* * * * *